(12) United States Patent
Yamashita

(10) Patent No.: US 9,880,215 B2
(45) Date of Patent: Jan. 30, 2018

(54) INSPECTION METHOD FOR BLANKING DEVICE FOR BLANKING MULTI CHARGED PARTICLE BEAMS

(71) Applicant: NuFlare Technology, Inc., Yokohama (JP)

(72) Inventor: Hiroshi Yamashita, Sagamihara (JP)

(73) Assignee: NuFlare Technology, Inc., Yokohama (JP)

( * ) Notice: Subject to any disclaimer, the term of this patent is extended or adjusted under 35 U.S.C. 154(b) by 316 days.

(21) Appl. No.: 14/836,065

(22) Filed: Aug. 26, 2015

(65) Prior Publication Data

US 2016/0061876 A1 Mar. 3, 2016

(30) Foreign Application Priority Data

Sep. 3, 2014 (JP) .................................. 2014-179658

(51) Int. Cl.
*G01R 31/14* (2006.01)
*G01R 31/02* (2006.01)
(Continued)

(52) U.S. Cl.
CPC .......... *G01R 31/025* (2013.01); *H01J 37/045* (2013.01); *H01J 37/3177* (2013.01);
(Continued)

(58) Field of Classification Search
CPC .... G01R 31/025; H01J 37/045; H01J 37/3177
See application file for complete search history.

(56) References Cited

U.S. PATENT DOCUMENTS 5,262,341 A * 11/1993 Fueki .................... H01J 37/045
216/12
5,910,658 A * 6/1999 Arai ....................... B82Y 10/00
250/398

(Continued)

FOREIGN PATENT DOCUMENTS

| DE | 69226553 | 12/1998 |
| JP | 2013-128031 | 6/2013 |
| KR | 10-2013-0036726 A | 4/2013 |

OTHER PUBLICATIONS

Korean Office Action dated May 31, 2016 in Patent Application No. 10-2015-0121587 (with English translation).

(Continued)

*Primary Examiner* — Daniel Miller
(74) *Attorney, Agent, or Firm* — Oblon, McClelland, Maier & Neustadt, L.L.P.

(57) ABSTRACT

An inspection method for a blanking device for multi-beams, for inspecting whether a separate blanking system of the blanking device is defective, includes, using the blanking device, measuring a value of current flowing from a power source for supplying voltage based on a difference between a first potential and a second potential to each of a plurality of separate blanking systems, in a state where the first potential is applied to a first electrode from a first potential applying unit and the second potential is applied to a second electrode from a corresponding second potential applying unit in at least one second potential applying unit in each of a plurality of separate blanking systems of the blanking device, and determining, when a measured current value is a finite value and equal to or below a preset threshold, that a separate blanking system where a short circuit has occurred exists.

10 Claims, 13 Drawing Sheets

(51) Int. Cl.
  *H01J 37/317* (2006.01)
  *H01J 37/04* (2006.01)
(52) U.S. Cl.
  CPC .................. *H01J 2237/0435* (2013.01); *H01J 2237/24514* (2013.01)

(56) References Cited

U.S. PATENT DOCUMENTS

| | | |
|---|---|---|
| 2005/0087701 A1 | 4/2005 | Lammer-Pachlinger et al. |
| 2005/0201246 A1 | 9/2005 | Buschbeck et al. |
| 2009/0114818 A1 | 5/2009 | Casares et al. |
| 2009/0212240 A1 | 8/2009 | Platzgummer et al. |
| 2010/0276606 A1 | 11/2010 | Baars et al. |
| 2012/0015303 A1* | 1/2012 | Hirata .................. H01J 37/045 430/296 |
| 2012/0164583 A1 | 6/2012 | Yamaguchi et al. |
| 2013/0068962 A1 | 3/2013 | Kawamoto |
| 2013/0082187 A1 | 4/2013 | Ogasawara |
| 2014/0106279 A1 | 4/2014 | Morita et al. |

OTHER PUBLICATIONS

German Office Action dated Oct. 30, 2017 in German Patent Application 10 2015 216 682.1 (English translation provided).

\* cited by examiner

| Status | In (Active H) | Cancel (Active L) | $\lvert I_1 \rvert$ | $\lvert I_2 \rvert$ | $I_{total}$ |
|---|---|---|---|---|---|
| Normal | H | H | $V_{dd}/R_1$ | 0 | $V_{dd}/R_1$ |
| Normal | H | L | $V_{dd}/R_1$ | $V_{dd}/(R_0+R_2)$ | $V_{dd}/R_1 + V_{dd}/(R_0+R_2)$ |
| Normal | L | H | 0 | 0 | 0 |
| Normal | L | L | 0 | $V_{dd}/(R_0+R_2)$ | $V_{dd}/(R_0+R_2)$ |
| Short between Electrodes | H | H | $V_{dd}/R_1$ | 0 | $V_{dd}/R_1$ |
| Short between Electrodes | H | L | $V_{dd}(R_0+R_1)/R_0R_1$ | $V_{dd}/R_0$ | $V_{dd}(R_0+R_1)/R_0R_1$ |
| Short between Electrodes | L | H | $V_{dd}(R_0+R_2)/R_0R_2$ | $V_{dd}/R_0$ | $V_{dd}(R_0+R_2)/R_0R_2$ |
| Short between Electrodes | L | L | $V_{dd}/R_2$ | 0 | $V_{dd}/R_2$ |
| Electrode Line Open | H | H | 0 | 0 | 0 |
| Electrode Line Open | H | L | 0 | $V_{dd}/(R_0+R_2)$ | $V_{dd}/(R_0+R_2)$ |
| Electrode Line Open | L | H | 0 | 0 | 0 |
| Electrode Line Open | L | L | 0 | $V_{dd}/(R_0+R_2)$ | $V_{dd}/(R_0+R_2)$ |

$R_{ds(on)} \ll R_0 \ll R_1, R_2,$
I: Current Value of Each Defective Separate Blanking System

FIG. 5

| Status | In (Active H) | Cancel (Active L) | $\|I_1\|$ | $\|I_2\|$ | $I_{total}$ |
|---|---|---|---|---|---|
| Normal | H | H | $V_{dd}/(R_0+R_1)$ | 0 | $V_{dd}/(R_0+R_1)$ |
| Normal | H | L | $V_{dd}/(R_0+R_1)$ | $V_{dd}/R_2$ | $V_{dd}/(R_0+R_1)+V_{dd}/R_2$ |
| Normal | L | H | 0 | 0 | 0 |
| Normal | L | L | 0 | $V_{dd}/R_2$ | $V_{dd}/R_2$ |
| Short between Electrodes | H | H | 0 | $V_{dd}/R_1$ | $V_{dd}/R_1$ |
| Short between Electrodes | H | L | $V_{dd}/R_1$ | $V_{dd}/R_2$ | $V_{dd}(R_0+R_2)/R_0R_2$ |
| Short between Electrodes | L | H | $V_{dd}/R_0$ | $V_{dd}(R_0+R_1)/R_0R_1$ | $V_{dd}(R_0+R_1)/R_0R_1$ |
| Short between Electrodes | L | L | 0 | $V_{dd}/R_2$ | $V_{dd}/R_2$ |
| Electrode Line Open | H | H | 0 | 0 | 0 |
| Electrode Line Open | H | L | 0 | $V_{dd}/R_2$ | $V_{dd}/R_2$ |
| Electrode Line Open | L | H | 0 | 0 | 0 |
| Electrode Line Open | L | L | 0 | $V_{dd}/R_2$ | $V_{dd}/R_2$ |

$R_{ds(on)} \ll R_0 \ll R_1, R_2,$
I:Current Value of Each Defective Separate Blanking System

FIG. 13

INSPECTION METHOD FOR BLANKING DEVICE FOR BLANKING MULTI CHARGED PARTICLE BEAMS

CROSS-RELATION TO RELATED APPLICATION

This application is based upon and claims the benefit of priority from the prior Japanese Patent Application No. 2014-179658 filed on Sep. 3, 2014 in Japan, the entire contents of which are incorporated herein by relation.

BACKGROUND OF THE INVENTION

Field of the Invention

Embodiments of the present invention relate generally to an inspection method for a blanking device for blanking multi charged particle beams, and more specifically, to an inspection method for a blanking device to be placed (mounted) in a multi-beam writing apparatus, for example.

Description of Related Art

The lithography technology that advances miniaturization of semiconductor devices is extremely important as a unique process whereby patterns are generated in semiconductor manufacturing. In recent years, with high integration of LSI, the linewidth (critical dimension) required for semiconductor device circuits is decreasing year by year. The electron beam (EB) writing technique, which intrinsically has excellent resolution, is used for writing or "drawing" a pattern on a photomask blank, etc. with electron beams.

As an example employing the electron beam writing technique, a writing apparatus using multiple beams (multi-beams) can be cited. Compared with the case of writing a pattern by using a single electron beam, since it is possible to emit multiple beams at a time (one shot) in multi-beam writing, the throughput can be greatly increased. For example, in a writing apparatus employing a multi-beam system, multi-beams are formed by letting portions of an electron beam emitted from an electron gun assembly pass through a corresponding hole of a plurality of holes in the mask, a blanking control is provided for each of the beams, and each unblocked beam is reduced by an optical system and deflected by a deflector so as to irradiate a desired position on a target object or "sample".

In multi-beam writing, the dose of each beam is separately controlled based on an irradiation time. For highly accurately controlling such a dose of each beam, it is necessary to perform high speed blanking control to provide an ON or OFF state of each beam. In a writing apparatus of a multi-beam system, a blanking control circuit for each beam is placed on a blanking plate where blankers each for each of multi-beams are arranged.

Here, each blanker for the multi-beams is configured by a pair of counter electrodes, and specifically, a voltage for blanking control is applied to a control electrode and the other counter electrode is grounded (earthed). In blanking control, a beam OFF state is generated by applying a positive potential to the control electrode, and a ground potential to the grounded counter electrode in order to deflect a beam toward the control electrode, so as not to let the beam pass through a limiting aperture of the blanking aperture member placed below the blankers. For example, when multi-beams are composed of n×n beams, n×n pairs of electrodes and their control circuits are arrayed in the blanking device. For example, with respect to a blanking device in which 512×512 pairs of electrodes and their control circuits are arrayed, it is reported that the fraction defective of the structure that is configured by the 512×512 pairs of electrodes and their control circuits is about 0.04%. As one of defects, there is a case in which a short circuit (short) has occurred between the electrodes by some malfunction. In such a case, a problem is generated in that since it is impossible to control ON/OFF of the beam, the blanking control function cannot be achieved. Moreover, as another of defects, there is a case in which the electrode is in a floating state due to a disconnection (open), etc. between the control circuit and the control electrode by some malfunction. Also, in such a case, a problem is generated in that since it is impossible to control ON/OFF of the beam, the blanking control function cannot be achieved. With respect to such defects of the structure produced by pairs of electrodes and their control circuits, it is conventionally difficult to check the beam control state before actually placing the blanking device in the writing apparatus and emitting each beam of the multi-beams. Moreover, even if performing an inspection after placing the blanking device in the writing apparatus, since the number of beams is enormous, the inspection will take time. Furthermore, if, after placing the blanking device in the writing apparatus, it turns out that the blanking device is unusable, it will be troublesome to perform exchange, etc.

Conventionally, as another defect, there is a problem in that when the beam state is fixed to ON, it becomes out of control. Then, a method is examined in which, before beams including such a defective beam irradiate the target object, a movable block member is transferred to be directly underneath the beams in order to compulsorily perform blocking (e.g., refer to Japanese Patent Application Laid-open (JP-A) No. 2013-128031).

However, conventionally, no efficient method has been established to inspect, at a stage before placing a blanking device in a writing apparatus, whether a beam defect is to occur in the system or not.

BRIEF SUMMARY OF THE INVENTION

According to one aspect of the present invention, an inspection method for a blanking device for multi charged particle beams, for inspecting whether a separate blanking system of the blanking device is defective, includes:

measuring a first current value of a current flowing from a power source that supplies a voltage based on a potential difference between a first potential and a second potential to each of a plurality of separate blanking systems, using the blanking device having the plurality of separate blanking systems, wherein the each of the plurality of separate blanking systems arranged in an array for performing blanking control of a corresponding beam in the multi charged particle beams, the each of the plurality of separate blanking systems includes a first potential applying unit configured to be able to alternatively selectively apply the first potential and the second potential, a first resistor configured to be applied with the first potential, a first electrode configured to be alternatively selectively applied with the first potential and the second potential from the first potential applying unit, and connected to the first resistor, a second resistor configured to be applied with the second potential, a second electrode configured to be connected to the second resistor, and alternatively selectively applied with the first potential and the second potential through a line, and a third resistor configured to be connected between the first potential applying unit and the first electrode or connected in series in the line, and the blanking device further includes at least one second potential applying unit configured to be able to alternatively selectively apply the first potential and the second potential to the second electrode of the each of the plurality of separate blanking systems, and the measuring is performed in a state where, in the each of the plurality of separate blanking systems, the first potential is applied to the first electrode from the first potential applying unit, and the second potential is applied to the second electrode from a corresponding second potential applying unit in the at least one second potential applying unit; and determining, when the first current value measured is a finite value and lower than or equal to a first threshold having been set in advance, that a separate blanking system in which a short circuit has occurred exists in the plurality of separate blanking systems, and outputting a result of the determining.

BRIEF DESCRIPTION OF THE DRAWINGS

FIG. 5 shows a relation of currents flowing through a separate blanking system according to the first embodiment;

FIG. 13 shows a relation of currents flowing through a separate blanking system according to the second embodiment.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Multiple charged particle beams composed of a plurality of charged particle beams are hereinafter called multi-beams.

In the following embodiments, there will be described a method that can inspect a blanking device at a stage before placing it in the writing apparatus.

First Embodiment

Figure 1:
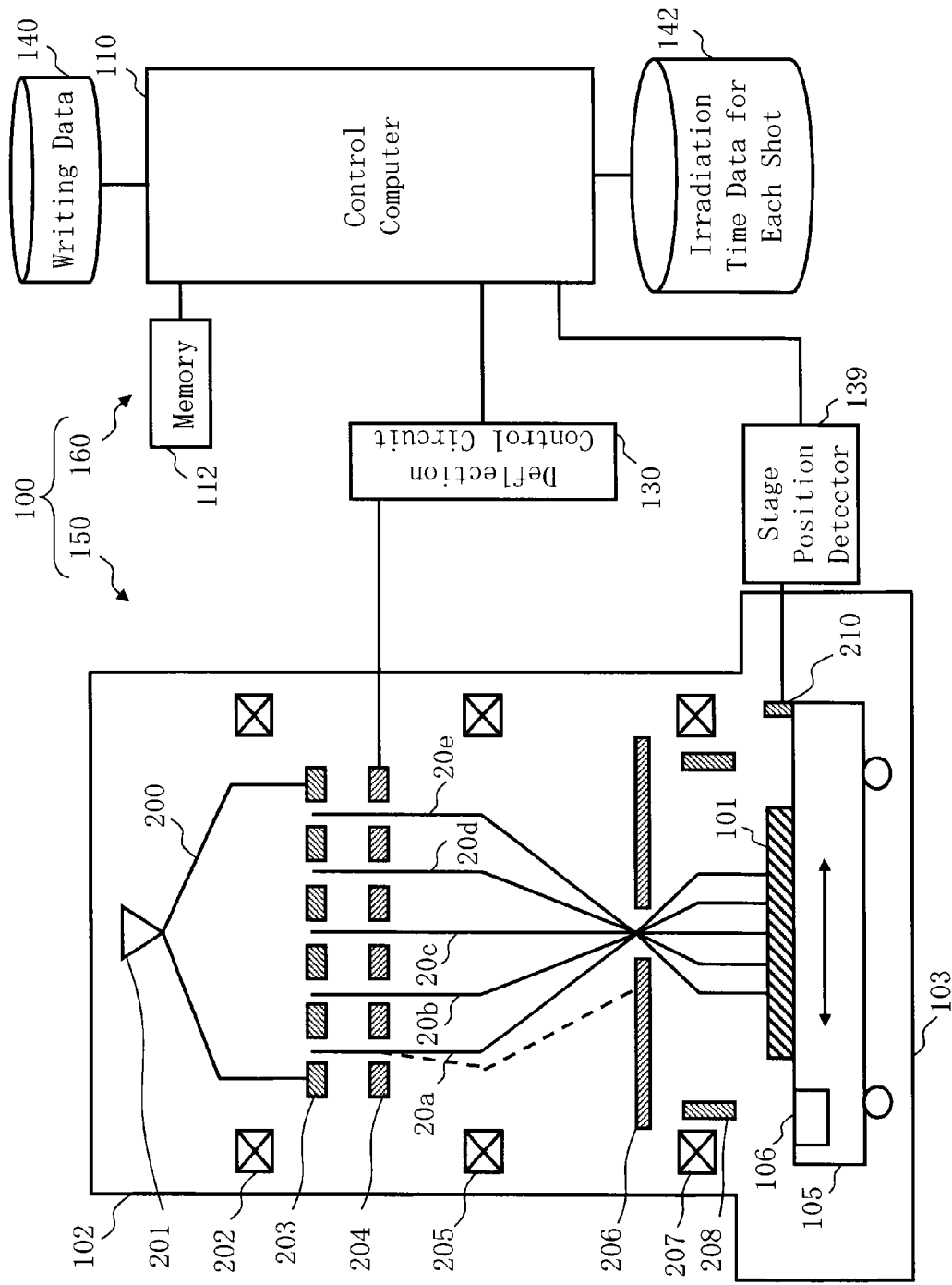
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, an XY stage 105 is arranged. On the XY stage 105, there are placed a Faraday cup 106 and a target object or "sample" 101 such as a mask blank serving as a writing target substrate when writing is performed. For example, the target object 101 is an exposure mask used for manufacturing semiconductor devices, or is a semiconductor substrate (silicon wafer) on which semiconductor elements are formed. The target object 101 has been coated with resist. A mirror 210 for measuring the position of the XY stage 105 is arranged on the XY stage 105. An He—Ne gas laser (wavelength of 633 nm) is usually used for position measurement.

The control unit 160 includes a control computer 110, a memory 112, a deflection control circuit 130, a stage position detector 139, and storage devices 140, and 142 such as magnetic disk drives. The control computer 110, the memory 112, the deflection control circuit 130, the stage position detector 139, and the storage devices 140 and 142 are mutually connected through a bus (not shown). Writing data is input from the outside to the storage device 140 (storage unit) to be stored therein.

Data which is input and output to/from the control computer 110, and data being operated are stored in the memory 112 each time.

FIG. 1 shows a configuration necessary for explaining the first embodiment. Other configuration elements generally necessary for the writing apparatus 100 may also be included.

Figure 2A:
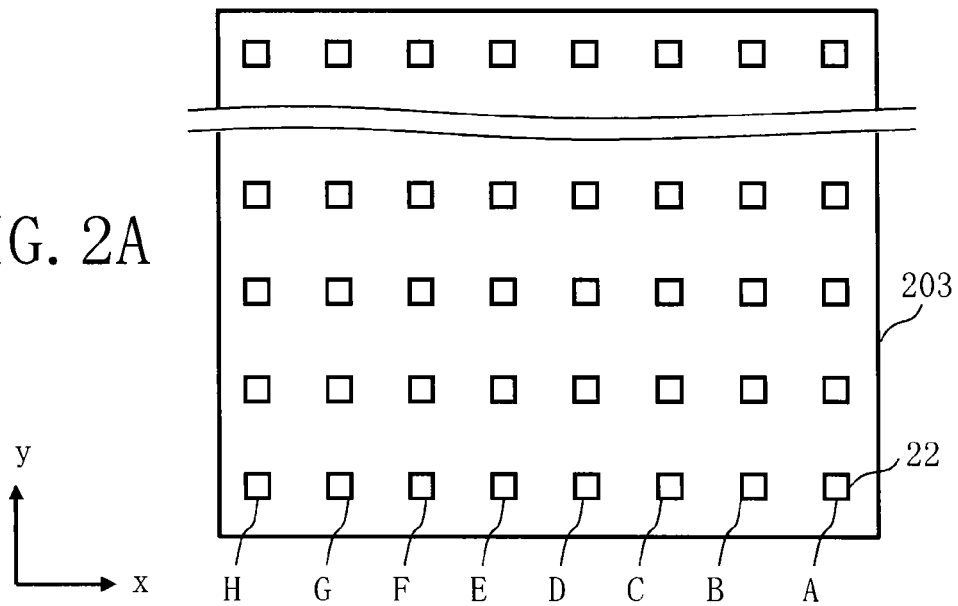
FIGS. 2A and 2B are conceptual diagrams each showing a configuration of an aperture member according to the first embodiment.
Figure 2B:
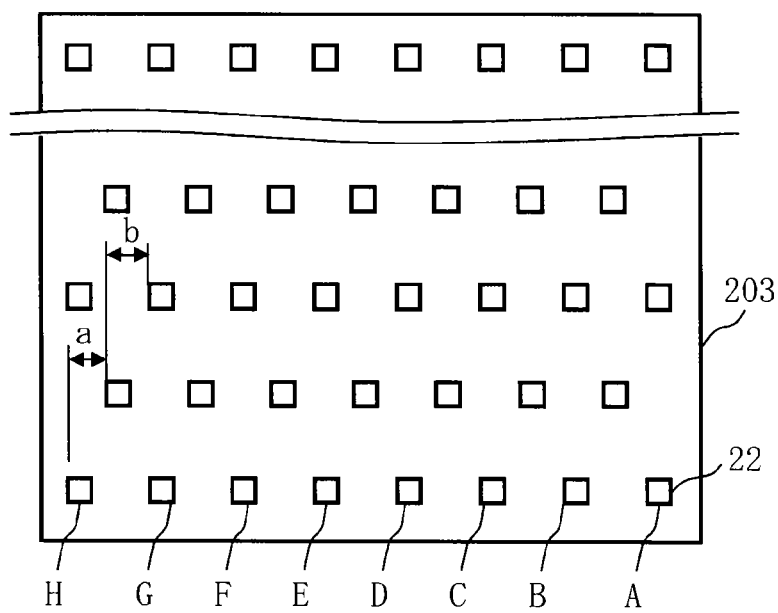

FIGS. 2A and 2B are conceptual diagrams each showing an example of the configuration of an aperture member according to the first embodiment. As shown in FIG. 2A, holes (openings) 22 of m rows long (y direction) and n columns wide (x direction) (m≥2, n≥2) are formed, like a matrix, in the aperture member 203 at a predetermined arrangement pitch. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows that are arrayed in the y direction has eight holes 22 from A to H in the x direction. Multi-beams 20 are formed by letting portions of an electron beam 200, which has been shaped by the aperture member 203, respectively pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
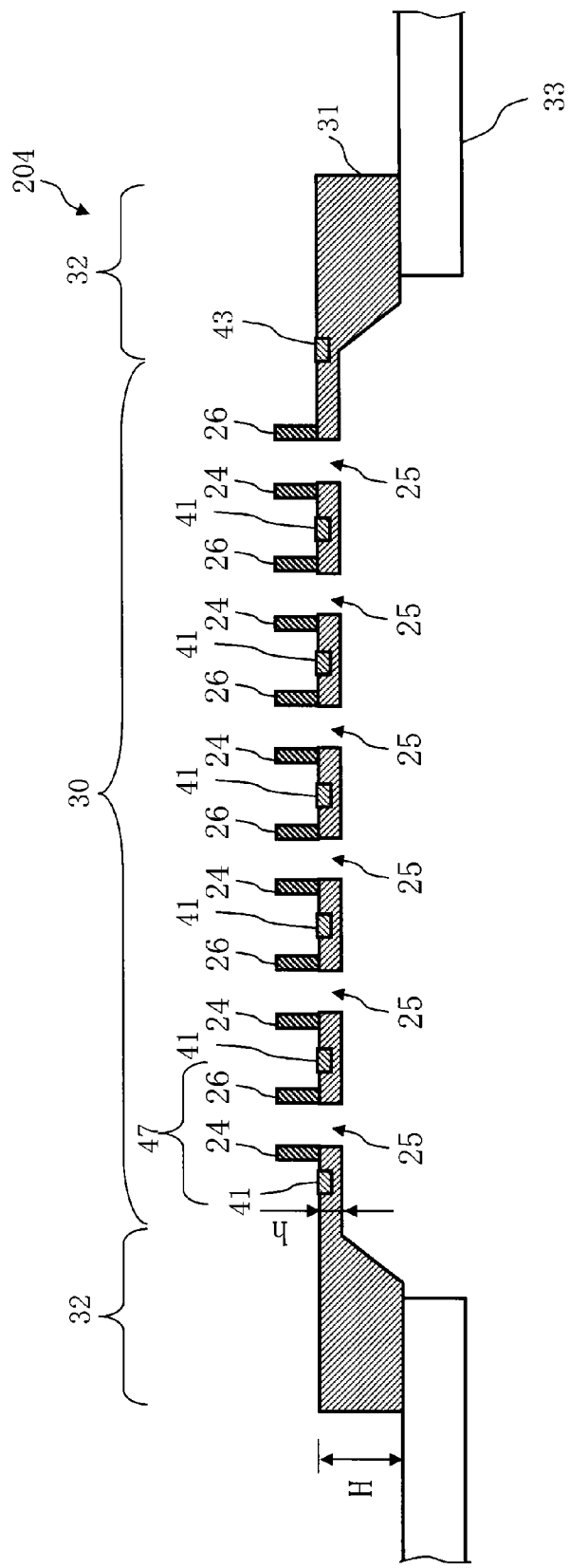
FIG. 3 is a sectional view showing a configuration of a blanking plate according to the first embodiment.

FIG. 3 is a sectional view showing the configuration of a blanking plate according to the first embodiment. In FIG. 3, the positional relation of a control electrode 24 and a counter electrode 26 and the positional relation of control circuits 41 and 43 are not in accordance with each other. With regard to the configuration of the blanking plate 204, as shown in FIG. 3, a semiconductor substrate 31 made of silicon, etc. is placed on a support table 33. The central part of the substrate 31 is scraped from the back side, for example, and processed to be a membrane region 30 (first region) whose thin film thickness is h. The circumference surrounding the membrane region 30 is a circumference region 32 (second region) whose thick film thickness is H. The upper surface of the membrane region 30 and the upper surface of the circumference region 32 are formed to have equal height positions, or substantially equal height positions. The substrate 31 is supported, at the back side of the circumference region 32, to be on the support table 33. The central part of the support table 33 is open, and the position of the membrane region 30 is located in the opening part of the support table 33.

In the membrane region 30, there are formed apertured passage holes 25 (openings) through which multi-beams respectively pass at the positions each corresponding to each hole 22 of the aperture member 203 shown in FIGS. 2A and 2B. As shown in FIG. 3, pairs of the control electrode 24 and the counter electrode 26 (blankers: blanking deflectors) for blanking deflection are arranged on the membrane region 30, and each of the pairs is close to and at opposite sides of a corresponding passage hole 25. Moreover, close to each passage hole 25 in the membrane region 30, there is arranged the control circuit 41 or "drive circuit 41" (logic circuit) for applying a deflection voltage to the control electrode 24 for each passage hole 25. The counter electrode 26 for each beam is earthed (grounded) through a pull-down resistor as to be described later. Moreover, the counter electrode 26 for each beam is connected, in parallel with the pull-down resistor, to the control circuit 43 or "drive circuit 43" (logic circuit: cancellation circuit). Preferably, a plurality of the counter electrodes 26 each for each beam on the blanking plate are grouped, and each group as a unit is connected to one control circuit 43. However, connection is not limited thereto. Each counter electrode 26 as a unit may be connected to one control circuit 43.

Moreover, a plurality of lines for control signals are connected to each control circuit 41. In addition to the lines for control, a clock signal line and a power source line are connected to each control circuit 41. A part of the lines for control signals may be used as the clock signal line and the power source line. A separate blanking system 47 composed of the control electrode 24, the counter electrode 26, and the control circuit 41 is configured for each of multi-beams. Moreover, in the example of FIG. 4, the control electrode 24, the counter electrode 26, and the control circuit 41 are arranged in the membrane region 30, having a thin film thickness, of the substrate 31, and the control circuit 43 (cancellation circuit) is arranged in the circumference region 32, having a thick film thickness, of the substrate 31. However, arrangement is not limited thereto. The control circuit 43 may also be arranged in the membrane region 30 of the substrate 31. Similarly, the control circuit 41 does not necessarily need to be arranged in the membrane region 30, and may be arranged in the circumference region 32.

The electron beam 20 passing through each passage hole 25 is deflected by voltages each independently applied to each of the pair of the two electrodes 24 and 26. Blanking control is provided by this deflection. In other words, each pair of the control electrode 24 and the counter electrode 26 provides a blanking deflection to a corresponding beam in multi-beams respectively having passed through a plurality of holes 22 (openings) of the aperture member 203.

Figure 4:
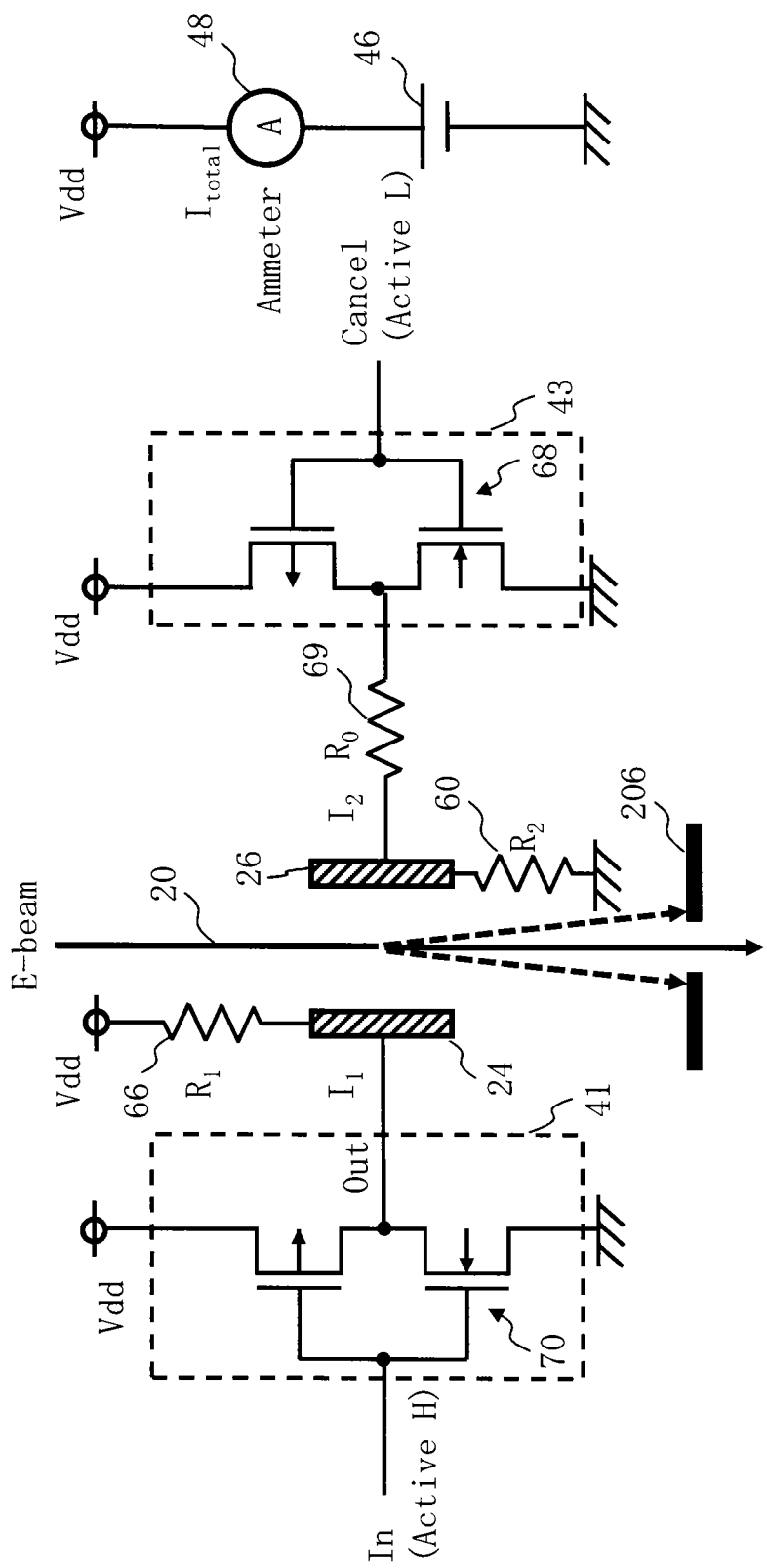
FIG. 4 shows an example of a separate blanking system according to the first embodiment.

FIG. 4 shows an example of a separate blanking system according to the first embodiment. In FIG. 4, each separate blanking system 47 provides a blanking control to a corresponding beam of the multi-beams. Each separate blanking system 47 includes the control circuit 41 (first potential applying unit), the control electrode 24 (first electrode), the counter electrode 26 (second electrode), a pull-up resistor 66 (first resistor), a pull-down resistor 60 (second resistor), and a protective resistor 69 (third resistor). The control circuit 41 is configured to selectively apply a positive potential (Vdd) (first electric potential) and a ground potential (second electric potential). The control electrode 24 is alternatively selectively provided with a positive potential (Vdd) or a ground potential from the control circuit 41, and the pull-up resistor 66 is connected to the positive potential (Vdd). The counter electrode 26 is grounded through the pull-down resistor 60, and alternatively selectively applied with a positive potential (Vdd) or a ground potential through a line. A positive potential (Vdd) is applied to the pull-up resistor 66. A ground potential is applied to the pull-down resistor 60. The protective resistor 69 is connected in series in the line between the control circuit 43 and the counter electrode 26. A plurality of separate blanking systems 47 are arranged on the blanking plate 204 (blanking device). Then, as described later, at least one control circuit 43 (cancellation circuit) (second potential applying unit) is arranged so that it can alternatively selectively apply a positive potential (Vdd) or a ground potential to the counter electrodes 26 of a plurality of separate blanking systems 47. Specifically, it is configured as described below.

In the control circuit 41, there is arranged a CMOS (complementary MOS) inverter circuit 70. The CMOS inverter circuit 70 is connected to a positive potential (Vdd: first electric potential) (e.g., 3.3 V), and a ground potential (second electric potential). An output line (OUT) of the CMOS inverter circuit is connected to the control electrode 24. In FIG. 4, although only the CMOS inverter circuit 70 is shown in the control circuit 41, it goes without saying that unillustrated circuits for transmitting data or inputting a signal into the CMOS inverter circuit, and like are arranged. For example, at the stage before the input line (IN), a shift register and a register are arranged for data transmission. Further, there is arranged a counter circuit for switching an input signal to the CMOS inverter circuit 70, based on a signal stored in the register.

The control electrode 24 is further applied with a positive potential (Vdd) through the pull-up resistor 66. The resistance value of the pull-up resistor 66 is set to a sufficiently high value. For example, the resistance value is preferably greater than or equal to several tens of kΩ, and more preferably greater than or equal to several hundreds of kΩ. Thereby, when the output potential of the control circuit 41 is a ground potential, the potential of the control electrode 24 becomes a ground potential, and thus, merely a current of about tens to hundreds of mA flows in the pull-up resistor 66. Therefore, beam deflection can be normally performed.

On the other hand, the counter electrode 26 is earthed (grounded) through the pull-down resistor 60. Moreover, the counter electrode 26 is connected to one of both the terminals of the protective resistor 69. The output terminal of the control circuit 43 is connected to the other of both the terminals of the protective resistor 69. The resistance value of the protective resistor 69 is set to a sufficiently low value. When a short occurs between the control electrode 24 and the counter electrode 26, even in a state in which a voltage is applied between the protective resistors 69, the inverter circuit of the control circuit 41 and the inverter circuit (described later) of the control circuit 43 can be protected by a voltage drop in the protective resistor 69. In other words, the inverter circuit of the control circuit 41 and the inverter circuit (described later) of the control circuit 43 can be protected by the protective resistor 69. In addition, the protective register 69 prevents an electron, scattered by the aperture member 203 on the blanking plate 204 and intruded through the counter electrode 26, from damaging the inverter circuit of the control circuit 43. Since the protective resistor 69 is usually inserted in the circuit which has no resistance (in order to reduce a time constant τ=CR by a stray capacitance C of the circuit), it is desirable to make the resistance value of the protective resistor 69 as low as possible. Considering a voltage division ratio between the protective resistor 69 and the pull-down resistor 60, the resistance value of the protective resistor 69 is preferably lower than or equal to several hundreds of Ω, and more preferably lower than or equal to several tens of Ω, for example.

In the control circuit 43, there is arranged a CMOS (complementary MOS) inverter circuit 68. The CMOS inverter circuit 68 is connected to a positive potential Vdd, and a ground potential. The power source of the positive potential (Vdd) is connected from a direct-current power source 46 of the electric potential to be applied to the CMOS inverter circuit 70 of the control circuit 41.

In the control circuit 43, the output line (OUT) of the CMOS inverter circuit 68 is connected to the counter electrode 26 through the protective resistor 69. With respect to the input (IN) of the CMOS inverter circuit 68, either a L (low) electric potential (e.g., ground potential) becoming lower than a threshold voltage, or a H (high) electric potential becoming higher than or equal to the threshold voltage is applied as a control signal. According to the first embodiment, in the state where an H electric potential is applied to the input (IN) of the CMOS inverter circuit, the output (OUT) of the CMOS inverter circuit becomes a ground potential, and although the pull-down resistor 60 and the protective resistor 69 are connected to the counter electrode 26, the current does not flow and a voltage drop does not occur in the protective resistor, and thus, the potential of the counter electrode 26 becomes a ground potential. Therefore, when the potential of the control electrode 24 is a positive potential (Vdd), it is controlled to be beam OFF by deflecting a corresponding beam 20 by a potential difference and performing blocking using the limiting aperture member 206. When the potential of the control electrode 24 is a ground potential, since there is no potential difference, a corresponding beam 20 is not deflected. Then, it is controlled to be beam ON by letting the beam pass through the limiting aperture member 206. Therefore, when in normal use without any problems, an H electric potential is applied to the input (IN) of the CMOS inverter circuit 68. Moreover, even if a disconnection (open) occurs in the output line of the control circuit 43, since the counter electrode 26 is grounded by the pull-down resistor, it becomes a ground potential. As a value of the pull-down resistor, similarly to the pull-up resistor, it is preferably greater than or equal to several tens of kΩ, and more preferably greater than or equal to several hundreds of kΩ, for example.

Here, if the electric potential of the control electrode 24 is always fixed to a ground potential by some reason, a corresponding beam 20 always irradiates the substrate. At this time, if an L electric potential (active potential) is applied to the input (IN) of the CMOS inverter circuit 68, the output of the control circuit 43 becomes a positive potential (Vdd). Thereby, since the electric potential of the counter electrode 26 substantially becomes a positive potential (Vdd), a beam OFF state can be obtained by deflecting a corresponding beam toward the counter electrode 26, which is opposite to the direction of the usual blanking deflection, to irradiate the limiting aperture member 206 by the beam. In other words, when the electric potential of the control electrode 24 (first electrode) is fixed to a ground potential, the control circuit 43 (electric potential change unit) changes the potential of the counter electrode 26 (second electrode), which is grounded, to a positive potential from the ground potential. Thus, the CMOS inverter circuit 68 (second potential applying unit) in the control circuit 43 (electric potential change unit) alternatively selectively applies two different electric potentials (Vdd, and ground potential) including a positive potential to the counter electrode 26 (second electrode).

Furthermore, if in a floating state between the control circuit 41 and the control electrodes 24 due to disconnection, etc., it becomes possible to make the potential of the control electrode 24 a positive potential (Vdd) through the pull-up resistor 66. Then, an H electric potential is applied to the input (IN) of the CMOS inverter circuit 68. Thereby, it becomes possible to make the potential of the counter electrode 26 a ground potential. Therefore, even using the separate blanking system 47 which cannot be controlled by the control circuit 41, since it becomes the same direction as that of the usual blanking deflection, unwanted electron beam irradiation can be avoided. On the other hand, if in a floating state between the control circuit 43 and the counter electrodes 26 due to disconnection, etc., it becomes possible to make the potential of the counter electrode 26 a ground potential through the pull-down resistor 60. Therefore, unless a failure, etc. occur between the control circuit 41 and the control electrode 24, it is also possible to use the blanking plate 204 as it is.

Although FIG. 4 shows a separate blanking system for one beam in the multi-beams, other separate blanking systems for remaining beams have the same configuration. The control circuit 43 (cancellation circuit) may be arranged for each separate blanking system, but it is not limited thereto. As explained referring to FIG. 4, a plurality of separate blanking systems 47 on the blanking plate 204 may be grouped into a plurality of groups, and one control circuit 43 may be arranged for each of the groups. If in the case of low inspection accuracy, one control circuit 43 (cancellation circuit) may be arranged for all the separate blanking systems 47 on the ranking plate 204. Thus, at least one control circuit 43 (cancellation circuit) (second potential applying unit) is arranged. A plurality of separate blanking systems 47 are arranged in an array on the blanking plate 204 (blanking device).

With respect to the direct-current power source 46 that supplies a positive potential (Vdd) and the ammeter 48, it may be sufficient to arrange one power source and one ammeter for the blanking plate 204 (blanking device). The negative electrode of the direct-current power source 46 is grounded. All the separate blanking systems 47 on the blanking plate 204 (blanking device) may be applied with positive potentials (Vdd) from the direct-current power source 46. Currents flowing through the CMOS inverter circuit 70, the pull-up resistor 66, and the CMOS inverter circuit 68, which are connected in parallel to the direct-current power source 46 that supplies a positive potential (Vdd), are collectively measured by the ammeter 48 connected in series to the direct-current power source 46. In addition, the ammeter 48 may be connected only when necessary.

FIG. 5 shows a relation of currents flowing through the separate blanking system according to the first embodiment. As shown in FIG. 5, the relation of currents flowing through the separate blanking system 47 is shown using a resistance value $R_1$ of the pull-up resistor 66, a resistance value $R_2$ of the pull-down resistor 60, a resistance value $R_0$ of the protective resistor 69, and a positive potential Vdd. FIG. 5 shows an absolute value $|I_1|$ of a current $I_1$ flowing between the CMOS inverter circuit 70 and the control electrode 24, an absolute value $|I_2|$ of a current $I_2$ flowing between the CMOS inverter circuit 68 and the counter electrodes 26, and a current value Itotal of all the currents flowing through the ammeter 48. FIG. 5 shows the states, namely: a normal state in which a normal blanking operation can be performed without any malfunction in the separate blanking system 47, a short-circuit state (short between electrodes) in which a short circuit (short) has occurred between the control electrode 24 and the counter electrodes 26, and a floating state (electrode line open) between the CMOS inverter circuit 70 and the control electrode 24 due to a disconnection, etc. between the CMOS inverter circuit 70 and the control electrode 24. In the state of electrode line open, even if a disconnection, etc. occur between the CMOS inverter circuit 70 and the control electrode 24, since the pull-up resistor 66 is connected to the control electrode 24, a positive potential Vdd is applied to the control electrode 24. Therefore, it goes without saying that the control electrode 24 does not actually become a floating state.

(1) "Normal" case will be described below.

(1-1) When the input of the CMOS inverter circuit 70 is an H electric potential and the input of the CMOS inverter circuit 68 is an H electric potential, the absolute value $|I_1|$ of a current $I_1$ is Vdd/$R_1$, the absolute value $|I_2|$ of a current $I_2$ is zero, and a current value Itotal of all the currents is Vdd/$R_1$.

(1-2) When the input of the CMOS inverter circuit 70 is an H electric potential and the input of the CMOS inverter circuit 68 is an L electric potential, the absolute value $|I_1|$ of the current $I_1$ is Vdd/$R_1$, the absolute value $|I_2|$ of the current $I_2$ is Vdd/($R_0+R_2$) and the current value Itotal of all the currents is Vdd/$R_1$+Vdd/($R_0+R_2$)

(1-3) When the input of the CMOS inverter circuit 70 is an L electric potential and the input of the CMOS inverter circuit 68 is an H electric potential, the absolute value $|I_1|$ of the current $I_1$ is zero, the absolute value $|I_2|$ of the current $I_2$ is zero, and the current value Itotal of all the currents is zero.

(1-4) When the input of the CMOS inverter circuit 70 is an L electric potential and the input of the CMOS inverter circuit 68 is an L electric potential, the absolute value $|I_1|$ of the current $I_1$ is zero, the absolute value $|I_2|$ of the current $I_2$ is Vdd/($R_0+R_2$) and the current value Itotal of all the currents is Vdd/($R_0+R_2$).

(2) "Short between electrodes" case will be described below.

(2-1) When the input of the CMOS inverter circuit 70 is an H electric potential and the input of the CMOS inverter circuit 68 is an H electric potential, the absolute value $|I_1|$ of the current $I_1$ is Vdd/$R_1$, the absolute value $|I_2|$ of the current $I_2$ is zero, and the current value Itotal of all the currents is Vdd/$R_1$.

(2-2) When the input of the CMOS inverter circuit 70 is an H electric potential and the input of the CMOS inverter circuit 68 is an L electric potential, the absolute value $|I_1|$ of the current $I_1$ is Vdd ($R_0+R_1$)/$R_0R_1$, and the absolute value $|I_2|$ of the current $I_2$ is Vdd/$R_0$. Since $|I_1|$ includes $|I_2|$, the current value Itotal of all the currents is Vdd ($R_0+R_1$)/$R_0R_1$.

(2-3) When the input of the CMOS inverter circuit 70 is an L electric potential and the input of the CMOS inverter circuit 68 is an H electric potential, the absolute value $|I_1|$ of the current $I_1$ is Vdd ($R_0+R_2$)/$R_0R_2$, and the absolute value $|I_2|$ of the current $I_2$ is Vdd/$R_0$. Since $|I_1|$ includes $|I_2|$, the current value Itotal of all the currents is Vdd ($R_0+R_2$)/$R_0R_2$.

(2-4) When the input of the CMOS inverter circuit 70 is an L electric potential and the input of the CMOS inverter circuit 68 is an L electric potential, the absolute value $|I_1|$ of the current $I_1$ is Vdd/$R_2$, the absolute value $|I_2|$ of the current $I_2$ is zero, and the current value Itotal of all the currents is Vdd/$R_2$.

(3) "Electrode line open" case will be described below.

(3-1) When the input of the CMOS inverter circuit 70 is an H electric potential and the input of the CMOS inverter circuit 68 is an H electric potential, the absolute value $|I_1|$ of the current $I_1$ is zero, the absolute value $|I_2|$ of the current $I_2$ is zero, and the current value Itotal of all the currents is zero.

(3-2) When the input of the CMOS inverter circuit 70 is an H electric potential and the input of the CMOS inverter circuit 68 is an L electric potential, the absolute value $|I_1|$ of the current $I_1$ is zero, the absolute value $|I_2|$ of the current $I_2$ is Vdd/($R_0+R_2$), and the current value Itotal of all the currents is Vdd/($R_0+R_2$).

(3-3) When the input of the CMOS inverter circuit 70 is an L electric potential and the input of the CMOS inverter circuit 68 is an H electric potential, the absolute value $|I_1|$ of the current $I_1$ is zero, the absolute value $|I_2|$ of the current $I_2$ is zero, and the current value Itotal of all the currents is zero.

(3-4) When the input of the CMOS inverter circuit 70 is an L electric potential and the input of the CMOS inverter circuit 68 is an L electric potential, the absolute value $|I_1|$ of the current $I_1$ is zero, the absolute value $|I_2|$ of the current $I_2$ is Vdd/($R_0+R_2$), and the current value Itotal of all the currents is Vdd/($R_0+R_2$).

Therefore, it turns out that when the input of the CMOS inverter circuit 70 is an L electric potential and the input of the CMOS inverter circuit 68 is an H electric potential, if the current value Itotal of all the currents is zero, the separate blanking system 47 to be measured is in the normal state in which a normal blanking operation can be performed without any malfunction, or in the floating state (electrode line open) between the CMOS inverter circuit 70 and the control electrode 24 due to disconnection, etc. between the CMOS inverter circuit 70 and the control electrode 24. On the other hand, it turns out that if the current value Itotal of all the currents is not zero but a finite value (Vdd($R_0+R_2$)/$R_0R_2$+ measurement error), the separate blanking system 47 to be measured is in the short-circuit state (Short between electrodes) where a short circuit (short) has occurred between the control electrode 24 and the counter electrodes 26.

If, when the input of the CMOS inverter circuit 70 is an L electric potential and the input of the CMOS inverter circuit 68 is an H electric potential, the current value Itotal of all the currents is zero, and when the input of the CMOS inverter circuit 70 is an H electric potential and the input of the CMOS inverter circuit 68 is an H electric potential, the current value Itotal of all the currents is not zero but a finite value (Vdd/$R_1$+ measurement error), it turns out that the separate blanking system 47 to be measured is in the normal state (Normal) where a normal blanking operation can be performed without any malfunction. On the other hand, if, when the input of the CMOS inverter circuit 70 is an L electric potential and the input of the CMOS inverter circuit 68 is an H electric potential, the current value Itotal of all the currents is zero, and when the input of the CMOS inverter circuit 70 is an H electric potential and the input of the CMOS inverter circuit 68 is an H electric potential, the current value Itotal of all the currents is zero, it turns out that the separate blanking system 47 to be measured is in a state (electrode line open) where the control electrode 24 is in a floating state.

In the case where the operation described above is performed simultaneously for a plurality of separate blanking systems 47, it will be described below. In such a case, the current value Itotal of all the currents is a resultant value of a plurality of separate blanking systems 47 to be measured.

It turns out that when the input of each CMOS inverter circuit 70 is an L electric potential and the input of each CMOS inverter circuit 68 is an H electric potential, if the current value Itotal of all the currents is zero, a plurality of separate blanking systems 47 to be measured are in the normal state where a normal blanking operation can be performed without any malfunction, or in a floating state (electrode line open) between the CMOS inverter circuit 70 and the control electrode 24 due to disconnection, etc. between the CMOS inverter circuit 70 and the control electrode 24. On the other hand, it turns out that if the current value Itotal of all the currents is not zero but a finite value (n·Vdd($R_0$+$R_2$)/$R_0R_2$+ measurement error), n separate blanking systems 47 of a plurality of separate blanking systems 47 to be measured are in a short-circuit state (Short between electrodes) where a short circuit (short) has occurred between the control electrode 24 and the counter electrodes 26.

If, when the input of the CMOS inverter circuit 70 is an L electric potential and the input of the CMOS inverter circuit 68 is an H electric potential, the current value Itotal of all the currents is zero, and when the input of the CMOS inverter circuit 70 is an H electric potential and the input of the CMOS inverter circuit 68 is an H electric potential, the current value Itotal of all the currents is not zero but a finite value (m·Vdd/$R_1$+ measurement error), it turns out that m separate blanking systems 47 of a plurality of separate blanking systems 47 (S separate blanking systems 47) to be measured are in the normal state where a normal blanking operation can be performed without any malfunction. Then, it turns out that the remaining (S−m) separate blanking systems 47 are in a floating state (electrode line open) between the CMOS inverter circuit 70 and the control electrode 24 due to disconnection, etc. between the CMOS inverter circuit 70 and the control electrode 24.

Then, according to the first embodiment, the blanking plate 204 is inspected by measuring the current value Itotal of all the currents and determining the measurement result. By employing the inspection method of the first embodiment, it becomes possible to inspect the blanking plate 204 (blanking device) at the stage before placing it in the writing apparatus 100.

Figure 6:
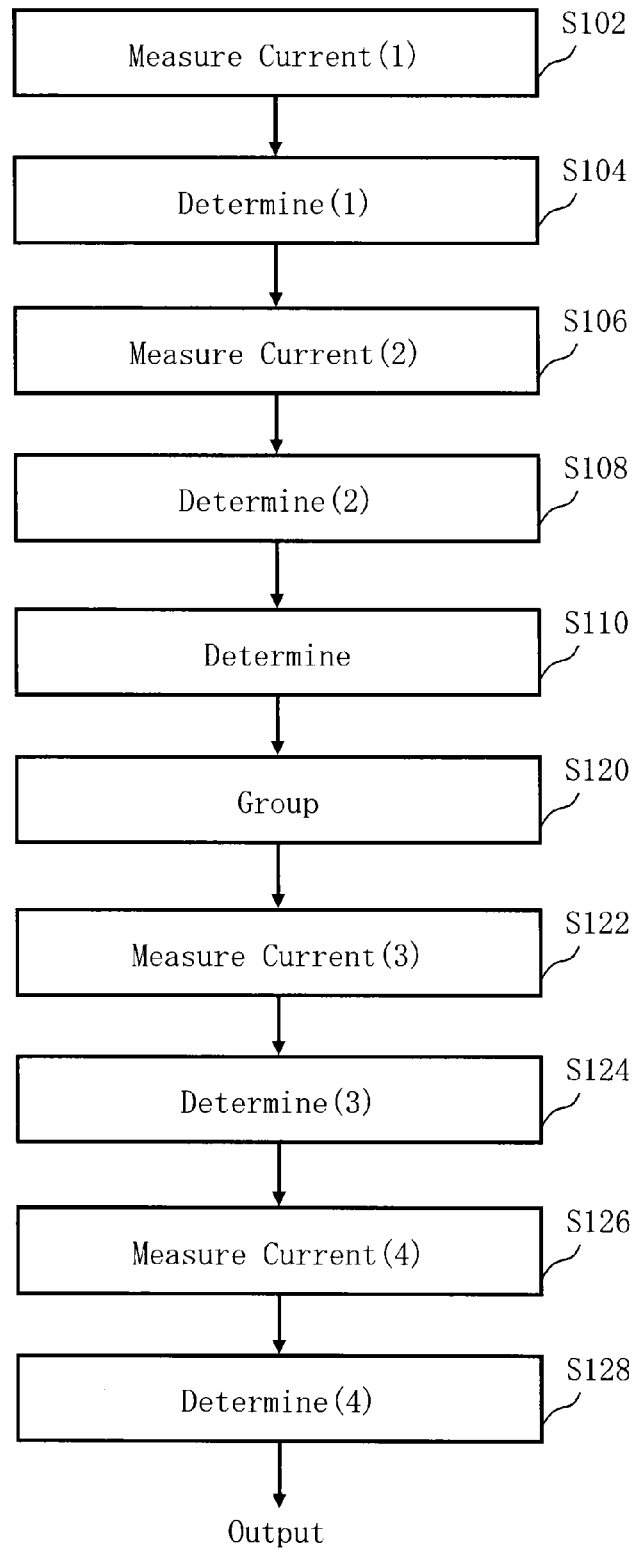
FIG. 6 is a flowchart showing main steps of an inspection method for a blanking device for multi-beams according to the first embodiment.

FIG. 6 is a flowchart showing main steps of an inspection method for a blanking device for multi-beams according to the first embodiment. As shown in FIG. 6, the inspection method for the blanking device for multi-beams of the first embodiment executes a series of steps: a current measurement (1) step (S102), a determination (1) step (S104), a current measurement (2) step (S106), a determination (2) step (S108), a determination step (S110), a grouping processing step (S120), a current measurement (3) step (S122), a determination (3) step (S124), a current measurement (4) step (S126), and a determination (4) step (S128).

In the current measurement (1) step (S102), regarding all the separate blanking systems 47 placed on the blanking plate 204 (blanking device) as targets to be measured, with respect to each separate blanking system 47, a direct current value (first current value) flowing from the direct-current power source 46 that supplies a voltage based on a potential difference between the positive potential Vdd and the ground potential to each separate blanking system 47 is measured in the state where a positive potential Vdd (first electric potential) is applied to the control electrode 24 (first electrode) from the control circuit 41 and a ground potential (second electric potential) is applied to the counter electrode 26 (second electrode) from a corresponding control circuit 43 in at least one control circuit 43 (second potential applying unit). Specifically, the current value Itotal of all the currents in the case where the input of each CMOS inverter circuit 70 is an L electric potential and the input of each CMOS inverter circuit 68 is an H electric potential is measured by the direct-current ammeter 48.

In the determination (1) step (S104), when a measured current value (first current value) is a finite value and lower than or equal to a preset threshold value (first threshold value), it is determined that there is the separate blanking system 47 in which a short circuit (short) has occurred in all the separate blanking systems 47 (a plurality of separate blanking systems 47) placed on the blanking plate 204 (blanking device). For example, when the number of the separate blanking systems 47 placed on the blanking plate 204 (blanking device) is S, if a short circuit has occurred in each of the S separate blanking systems 47, the current value Itotal of all the currents is theoretically a finite value of S·Vdd($R_0$+$R_2$)/$R_0R_2$. Moreover, if a short circuit has occurred in each of n separate blanking systems 47 in the S separate blanking systems 47, the current value Itotal of all the currents is theoretically a finite value of n·Vdd($R_0$+$R_2$)/$R_0R_2$. However, actually, since a measurement error is included, it is difficult to perform measurement using a theoretical value. Then, according to the first embodiment, a permissible value "a" for the number of short circuits (shorts) to occur on the blanking plate 204 is set in advance. Then, a threshold value is preset using the permissible value "a". For example, the threshold value is set to a finite value of a·Vdd($R_0$+$R_2$)/$R_0R_2$. If a measured current value Itotal is not zero but a finite value less than or equal to the threshold value, it is determined that there are separate blanking systems 47 in each of which a short circuit (short) has occurred and whose number is within the permissible value. When a measured current value Itotal exceeds the threshold value, it is determined that the blanking plate 204 concerned is unusable.

On the other hand, when the current value Itotal of all the currents is zero, it is determined that all the separate blanking systems 47 (a plurality of separate blanking systems 47) placed on the blanking plate 204 (blanking device) are respectively in the normal state (Normal) where a normal blanking operation can be performed without any malfunction, or in an open state (electrode line open) between the CMOS inverter circuit 70 and the control electrode 24 due to disconnection, etc. between the CMOS inverter circuit 70 and the control electrode 24. The determination result is output.

In the current measurement (2) step (S106), while regarding all the separate blanking systems 47 as targets to be measured, with respect to each separate blanking system 47, a current value (second current value) flowing from the direct-current power source 46 is measured in the state where a ground potential (second electric potential) is applied to the control electrode 24 (first electrode) from the control circuit 41 and a ground potential (second electric potential) is applied to the counter electrode 26 (second electrode) from a corresponding control circuit 43 (second potential applying unit). Specifically, the current value Itotal of all the currents in the case where the input of each CMOS inverter circuit 70 is an H electric potential and the input of each CMOS inverter circuit 68 is an H electric potential is measured by the direct-current ammeter 48.

In the determination (2) step (S108), when a measured current value (second current value) is a finite value and lower than a preset threshold value (second threshold value), it is determined that the separate blanking systems 47 in each of which a disconnection has occurred and whose number exceeds a preset allowable number "b" (first allowable number) exist in all the separate blanking systems 47 (a plurality of separate blanking systems 47) placed on the blanking plate 204 (blanking device). For example, when the number of the separate blanking systems 47 placed on the blanking plate 204 (blanking device) is S, if the S separate blanking systems 47 are in the normal state (Normal) in which a normal blanking operation can be performed without any malfunction, the current value Itotal of all the currents is theoretically a finite value of $S \cdot Vdd/R_1$. If m separate blanking systems 47 in the S separate blanking systems 47 are in the normal state (Normal) where a normal blanking operation can be performed without any malfunction, the current value Itotal of all the currents is theoretically a finite value of $m \cdot Vdd/R_1$. However, actually, since a measurement error is included, it is difficult to perform measurement using a theoretical value. Then, according to the first embodiment, the allowable number "b" of the number of separate blanking systems 47 in each of which a disconnection is to occur on the blanking plate 204 is set in advance. Then, a threshold value is preset using the allowable number "b". For example, the threshold value is set to a finite value of $(S-b) \cdot Vdd/R_1$. If a measured current value Itotal is lower than the threshold value, it is determined that the number of the separate blanking systems 47 in the normal state (Normal) where a normal blanking operation can be performed without any malfunction is insufficient, in other words, the separate blanking systems 47 in each of which a disconnection has occurred and whose number exceeds the preset allowable number "b" (first allowable number) exist in all the separate blanking systems 47 (a plurality of separate blanking systems 47) placed on the blanking plate 204 (blanking device). The determination result is output.

In the determination step (S110), it is determined that the blanking plate 204 (blanking device) is usable when a measured current value (second current value) is greater than or equal to the threshold value (second threshold value). However, even if the current value (first current value) measured at the determination (1) step (S104) is not zero but a finite value and lower than or equal to a preset threshold value (first threshold value), since a potential difference does not occur between short-circuited electrodes, it is difficult to provide a blanking control to be in a beam OFF state. That is, after such blanking plate having been mounted in the writing apparatus 100, the state is fixed to beam ON. Therefore, if there is no measure to avoid being fixed to the beam ON state, a defective beam will continue to radiate. Thus, in such a case, it should be determined that the blanking plate 204 concerned is unusable. The determination result is output.

By the steps described above, it is possible to first determine whether each blanking plate 204 (blanking device) is usable or not. When determined to be usable, next, a defective separate blanking system (malfunctioning part) is to be specified in all the separate blanking systems 47 placed on the blanking plate 204 (blanking device). Specifying a malfunctioning part can be determined for each group described below as a unit.

In the grouping processing step (S120), all the separate blanking systems 47 (a plurality of separate blanking systems) placed on the blanking plate 204 (blanking device) are grouped into a plurality of groups, each composed of a plurality of separate blanking systems.

Figure 7A:
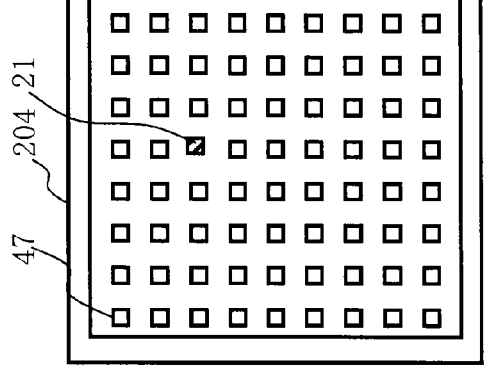
FIGS. 7A and 7B show an example of a grouping method according to the first embodiment.
Figure 7B:
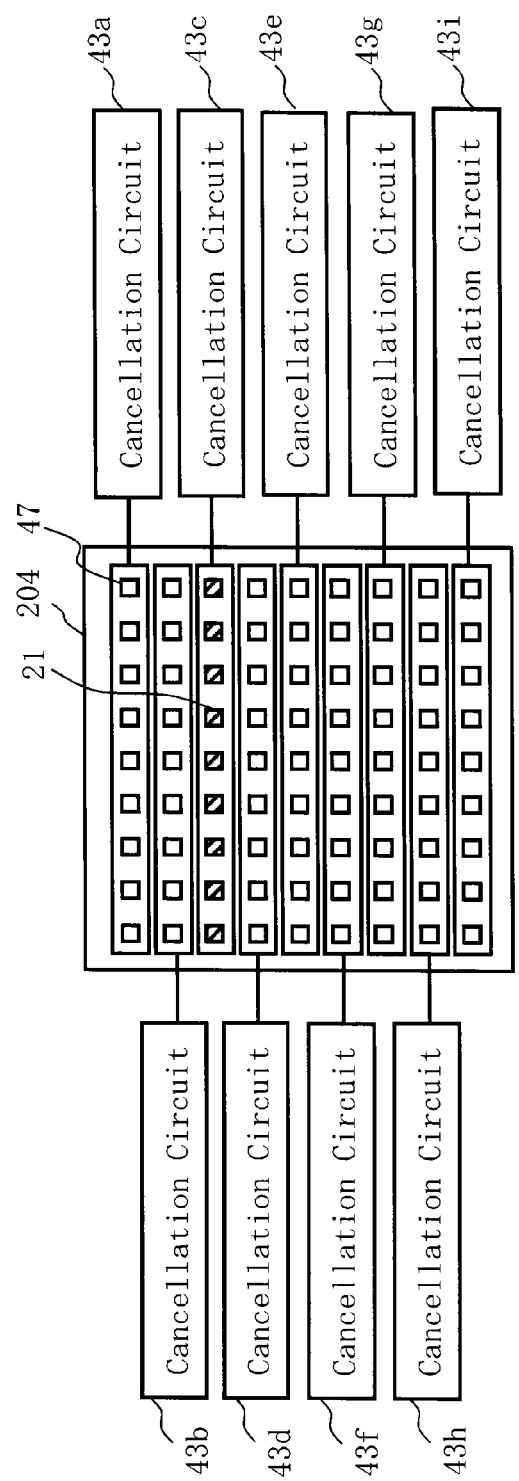

FIGS. 7A and 7B show an example of a grouping method according to the first embodiment. The example of FIG. 7A shows the case in which a separate blanking system 21 in the third row from the top and the fifth column from the left is a constant defective separate blanking system (malfunctioning part) in 9×9, for example, separate blanking systems 47 on the blanking plate 204 for blanking-controlling the multi-beams 20. The example of FIG. 7B shows groups each composed of all the separate blanking systems 47 (in this case, nine separate blanking systems 47) in the same row in the direction of the x-axis, where the rows are arrayed in the y direction. One control circuit 43 (cancellation circuit) is arranged for each group. In the example of FIG. 7B, a control circuit 43*a* is arranged for a group of the separate blanking systems 47 in the first row from the top. A control circuit 43*b* is arranged for a group of the separate blanking systems 47 in the second row from the top. A control circuit 43*c* is arranged for a group of the separate blanking systems 47 in the third row from the top. A control circuit 43*d* is arranged for a group of the separate blanking systems 47 in the fourth row from the top. A control circuit 43*e* is arranged for a group of the separate blanking systems 47 in the fifth row from the top. Similarly, control circuits 43*f* to 43*i* are arranged respectively for groups of the separate blanking systems 47 in respective rows from the sixth to the ninth rows. As shown in FIG. 7B, each row (x direction) configures one group.

Figure 8:
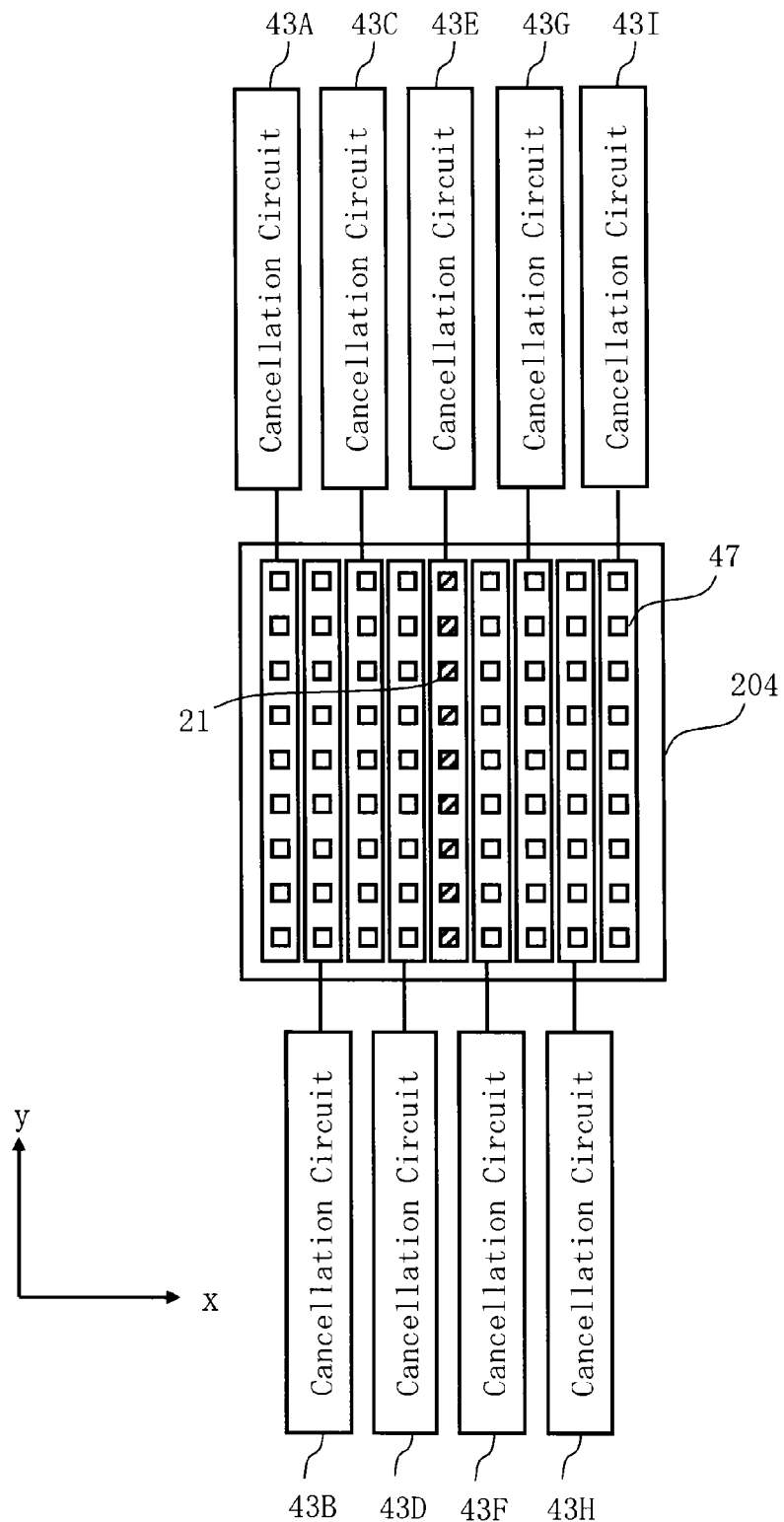
FIG. 8 shows another example of the grouping method according to the first embodiment.

FIG. 8 shows another example of the grouping method according to the first embodiment. The case of FIG. 8 shows groups each composed of all the separate blanking systems 47 (in this case, nine separate blanking systems 47) in the same column in the direction of the y-axis, where the columns are arrayed in the x direction. One control circuit 43 (cancellation circuit) is arranged for each group. In the example of FIG. 8, a control circuit 43A is arranged for a group of the separate blanking systems 47 in the first column from the left. A control circuit 43B is arranged for a group of the separate blanking systems 47 in the second column from the left. A control circuit 43C is arranged for a group of the separate blanking systems 47 in the third column from the left. A control circuit 43D is arranged for a group of the separate blanking systems 47 in the fourth column from the left. A control circuit 43E is arranged for a group of the separate blanking systems 47 in the fifth column from the left. Similarly, control circuits 43F to 43I are arranged respectively for groups of the separate blanking systems 47 in respective columns from the sixth to the ninth columns. As shown in FIG. 8, each column (y direction) configures one group.

Figure 9:
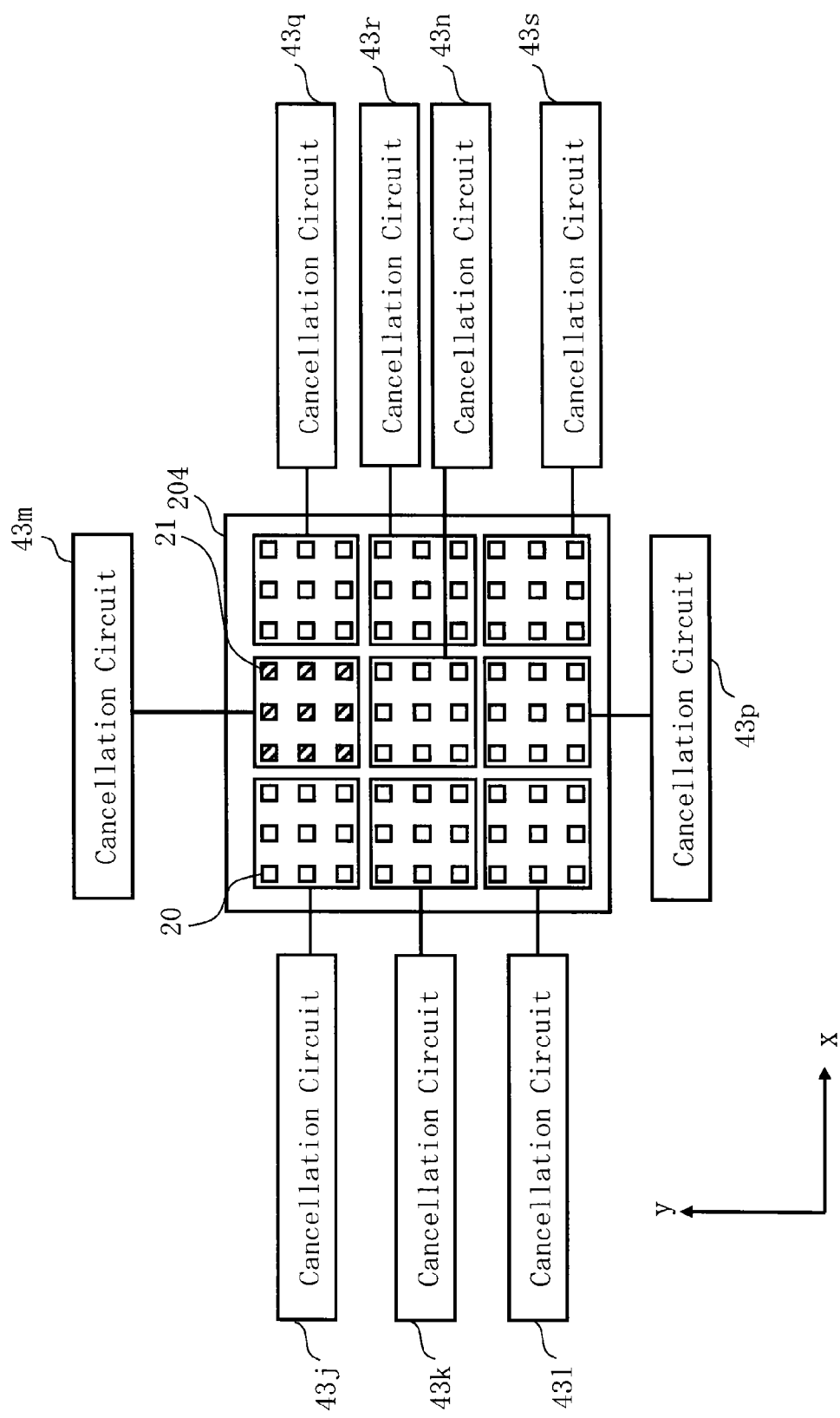
FIG. 9 shows another example of the grouping method according to the first embodiment.

FIG. 9 shows another example of the grouping method according to the first embodiment. In FIG. 9, one group is composed of m×m separate blanking systems 47 in the n×n separate blanking systems 47. In the case of FIG. 9, one group is composed of 3×3 separate blanking systems 47 in the 9×9 separate blanking systems 47, for example. One control circuit 43 (cancellation circuit) is arranged for each group. In the example of FIG. 9, a control circuit 43j is arranged for a left top group (group of first in x direction and first in -y direction from left top) of 3×3 separate blanking systems 47. A control circuit 43k is arranged for a left middle group (group of first in x direction and second in -y direction from left top) of 3×3 separate blanking systems 47. A control circuit 43l is arranged for a left bottom group (group of first in x direction and third in -y direction from left top) of 3×3 separate blanking systems 47. A control circuit 43m is arranged for a middle top group (group of second in x direction and first in -y direction from left top) of 3×3 separate blanking systems 47. A control circuit 43n is arranged for a middle group (group of second in x direction and second in -y direction from left top) of 3×3 separate blanking systems 47. A control circuit 43p is arranged for a middle bottom group (group of second in x direction and third in -y direction from left top) of 3×3 separate blanking systems 47. A control circuit 43q is arranged for a right top group (group of third in x direction and first in -y direction from left top) of 3×3 separate blanking systems 47. A control circuit 43r is arranged for a right middle group (group of third in x direction and second in -y direction from left top) of 3×3 separate blanking systems 47. A control circuit 43s is arranged for a right bottom group (group of third in x direction and third in -y direction from left top) of 3×3 separate blanking systems 47. That is, as shown in FIG. 9, one group is composed of the separate blanking systems 47 arrayed, in a block, in the width (x direction) and the length (y direction). It is not necessary for the numbers of the separate blanking systems 47 in the length array (y direction) and the width array (x direction) to be the same.

Figure 10:
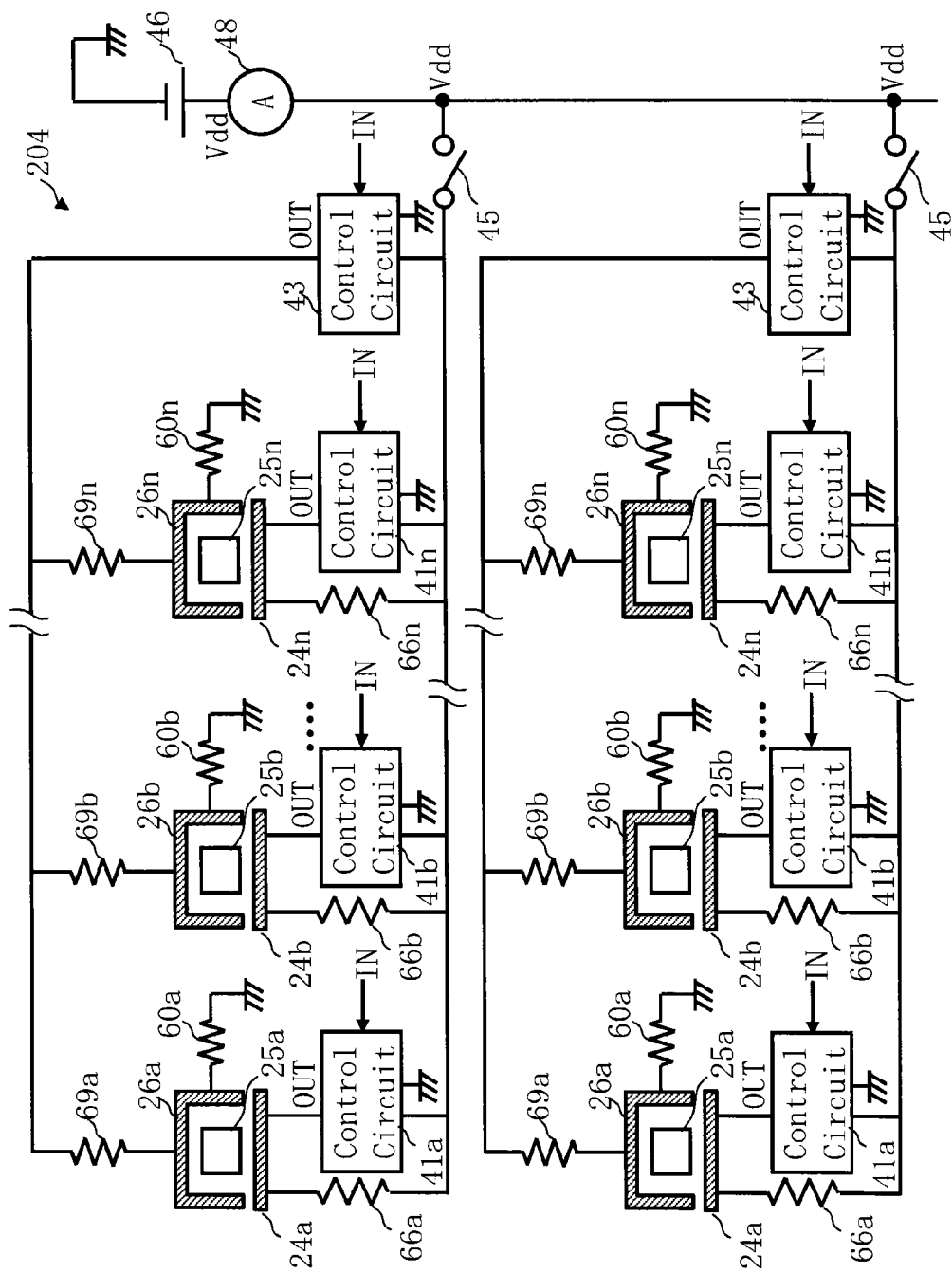
FIG. 10 shows an example of a configuration in which one cancellation circuit is arranged for a plurality of separate blanking systems according to the first embodiment.

FIG. 10 shows an example of a configuration in which one cancellation circuit is arranged for a plurality of separate blanking systems according to the first embodiment. The example of FIG. 10 shows the case where one control circuit 43 (cancellation circuit) is arranged for each group composed of separate blanking systems 47a to 47n grouped by one of the methods of FIGS. 7A to 9. FIG. 10 shows a portion of the upper surface of the blanking plate 204. In the separate blanking system 47a, a control circuit 41a and a pull-up resistor 66a are connected in parallel to a control electrode 24a. A positive potential (Vdd) supplied from the direct-current power source 46 is applied to the pull-up resistor 66a. Moreover, a positive potential (Vdd) supplied from the direct-current power source 46 and ground potential are applied to the CMOS inverter circuit 70, shown in FIG. 4, in the control circuit 41a. The grounded pull-down resistor 60a and a protective resistor 69a are connected in parallel to a counter electrode 26a. Similarly, in the separate blanking system 47b, a control circuit 41b and a pull-up resistor 66b are connected in parallel to a control electrode 24b. A positive potential (Vdd) supplied from the direct-current power source 46 is applied to the pull-up resistor 66b. Moreover, a positive potential (Vdd) supplied from the direct-current power source 46 and ground potential are applied to the CMOS inverter circuit 70, shown in FIG. 4, in the control circuit 41b. The grounded pull-down resistor 60b and a protective resistor 69b are connected in parallel to a counter electrode 26b. The same applies to other separate blanking systems 47 in the same group.

Protective resistors 69a to 69n of the separate blanking systems 47 in the same group are connected to the output of the CMOS inverter circuit 68, shown in FIG. 4, in the control circuit 43 (cancellation circuit). A positive potential (Vdd) supplied from the direct-current power source 46 and ground potential are applied to the CMOS inverter circuit 68, shown in FIG. 4, in the control circuit 43. Each group has the same configuration. Lines, each supplying a positive potential Vdd to each group, are connected in parallel with each other to one of both the ends of a switch 45 for the group concerned, and the other end of the switch 45 is connected, in parallel with that of other switch 45, to the positive terminal of the direct-current power source 46. The ammeter 48 is connected in series to the direct-current power source 46. The negative terminal of the direct-current power source 46 is grounded. This structure enables to separate the supply of the positive potential (Vdd) for each group as a unit by switching ON/OFF of the switch 45. In other words, inspection of the separate blanking systems 47 can be performed for each group.

In the current measurement (3) step (S122), while regarding, as measurement targets, the separate blanking systems 47 in a group to be measured in all the separate blanking systems 47 placed on the blanking plate 204 (blanking device), in each group, with respect to each separate blanking system 47 in the group concerned, a current value (third current value) flowing from the direct-current power source 46 that supplies voltages of the positive potential Vdd and the ground potential to each separate blanking system in the group concerned is measured in the state where a positive potential Vdd (first electric potential) is applied to the control electrode 24 (first electrode) from the control circuit 41 (first potential applying unit), a ground potential (second electric potential) is applied to the counter electrode 26 (second electrode) from the control circuit 43 (second potential applying unit) for the group concerned, and a current is controlled not to flow in each separate blanking system 47 in the other groups. Specifically, the current value Itotal of all the currents in the case where, in a group to be measured, the input of each CMOS inverter circuit 70 is an L electric potential and the input of each CMOS inverter circuit 68 is an H electric potential is measured by the direct-current ammeter 48 while the switch 45 is made to be off (open) with respect to groups other than the group to be measured.

In the determination (3) step (S124), with respect to each group, when a measured current value Itotal (third current value) of all the currents is not zero but a finite value, it is determined that there is the separate blanking system 47 in which a short circuit (short) has occurred in the separate blanking systems 47 in the group concerned. For example, when the number of the separate blanking systems 47 in a group to be measured is S', if a short circuit has occurred in each of the S' separate blanking systems 47, the current value Itotal of all the currents is theoretically a finite value of $S' \cdot Vdd(R_0+R_2)/R_0R_2$. If a short circuit has occurred in each of n' separate blanking systems 47 in the S' separate blanking systems 47, the current value Itotal of all the currents is theoretically a finite value of $n' \cdot Vdd(R_0+R_2)/R_0R_2$. Therefore, when the current value Itotal of all the currents is a finite value, it turns out that there is, in the group concerned, the separate blanking system 47 in which a short circuit (short) has occurred. Then, with respect to the group including the separate blanking system 47 in which a short circuit (short) has occurred, measures will be taken so that beams may not reach the target object 101 when mounted in the writing apparatus 100.

On the other hand, when the current value Itotal of all the currents is zero, it is determined that the separate blanking systems 47 in the group concerned are respectively in the normal state (Normal) in which a normal blanking operation can be performed without any malfunction, or in a floating state (electrode line open) between the CMOS inverter circuit 70 and the control electrode 24 due to disconnection etc. between the CMOS inverter circuit 70 and the control electrode 24. The determination result is output.

In the current measurement (4) step (S126), for each group, with respect to each separate blanking system 47 in the group concerned, a current value (fourth current value) flowing from the direct-current power source 46 is measured in the state where a ground potential (second electric potential) is applied to the control electrode 24 (first electrode) from the control circuit 41 (first potential applying unit), a ground potential (second electric potential) is applied to the counter electrode 26 (second electrode) from the control circuit 43 (second potential applying unit) for the group concerned, and a current is controlled not to flow in each separate blanking system 47 in the other groups. Specifically, the current value Itotal of all the currents in the case where, in a group to be measured, the input of each CMOS inverter circuit 70 is an H electric potential and the input of each CMOS inverter circuit 68 is an H electric potential is measured by the ammeter 48 while the switch 45 is made to be off (open) with respect to groups other than the group to be measured.

In the determination (4) step (S128), with respect to each group, when a measured current value (fourth current value) is a finite value and lower than a preset threshold value (third threshold value), it is determined that there is the separate blanking system 47 in which disconnection has occurred in the separate blanking systems 47 in the group concerned. For example, when the number of the separate blanking systems 47 in a group to be measured is S', if the S' separate blanking systems 47 are respectively in the normal state (Normal) in which a normal blanking operation can be performed without any malfunction, the current value Itotal of all the currents is theoretically a finite value of $S' \cdot Vdd/R_1$. Therefore, the threshold value is set in advance. For example, the threshold value is set to a finite value of $5' \cdot Vdd/R_1$. Then, if a measured current value Itotal is lower than the threshold value, it turns out that the separate blanking system 47 in which disconnection has occurred exists in the group concerned. The determination result is output.

By performing the steps from the current measurement (3) step (S122) to the determination (4) step (S128) described above, a group in which a short circuit has occurred and a group in which a disconnection has occurred can be specified.

According to the first embodiment described above, it is possible to inspect whether a separate blanking system in which a short circuit (short) has occurred exists in the blanking plate 204 (blanking device) or not at the stage before mounting the blanking plate 204 in the writing apparatus 100. Moreover, it is possible to inspect whether a separate blanking system in which a disconnection has occurred between the control circuit 41 and the control electrode 24 exists in the blanking plate 204 (blanking device) or not at the stage before mounting the blanking plate 204 in the writing apparatus 100. Furthermore, it is possible in each group to specify the separate blanking system, for each group, in which a short circuit (short) has occurred or a disconnection has occurred between the control circuit 41 and the control electrode 24.

When mounting the blanking plate 204 in the writing apparatus 100, disconnection between the control circuit 41 and the control electrode 24 can be controlled to be in a beam OFF state by using the control circuit 43 (cancellation circuit). Therefore, if it is possible to specify the group in which the disconnection has occurred, the writing operation can be proceeded by controlling all the separate blanking systems 47 in the group concerned to be beam OFF. On the other hand, when a short circuit has occurred between the control electrode 24 and the counter electrode 26, it is difficult to control the beam to be off by using the control circuit 43 (cancellation circuit). Therefore, if the group in which a short circuit has occurred can be specified, beams emitted from the separate blanking systems 47 in the group concerned need to be blocked. Moreover, when the electric potential of the control electrode 24 is fixed to a ground potential due to malfunction of the control circuit 41, etc., and it becomes impossible for the control circuit 41 to perform controlling, the control circuit 43 (cancellation circuit) can control the beams to be off. Operations of the writing apparatus 100 in which the blanking plate 204 having been inspected is mounted will be described below.

Figure 11:
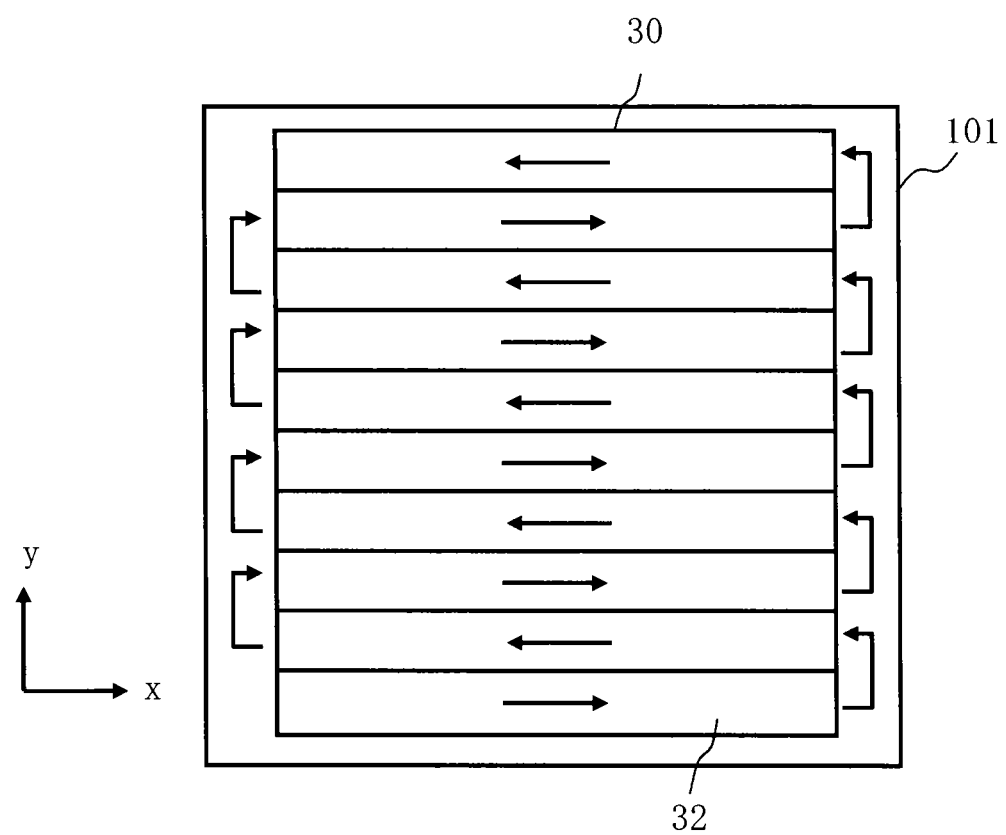
FIG. 11 is a conceptual diagram explaining an example of a writing operation according to the first embodiment.

FIG. 11 is a conceptual diagram explaining an example of a writing operation according to the first embodiment. As shown in FIG. 11, a writing region 30 of the target object 101 is virtually divided into a plurality of stripe regions 32 each in a strip shape and each having a predetermined width in the y direction, for example. Each of the stripe regions 32 serves as a unit region for writing. First, the XY stage 105 is moved to make an adjustment such that an irradiation region 34 which can be irradiated by one irradiation of the multi-beams 20 is located at the left end of the first stripe region 32 or at a position more left than the left end, and then writing is started. When writing the first stripe region 32, by moving the XY stage 105 in the −x direction, for example, the writing advances relatively in the x direction. The XY stage 105 is, for example, continuously moved at a predetermined speed. After writing the first stripe region 32, the stage position is moved in the −y direction to make an adjustment such that the irradiation region 34 is located at the right end of the second stripe region 32 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, a plurality of shot patterns whose number is equal to the number of the holes 22 are formed at a time by multi-beams which have been formed by passing through respective corresponding holes 22 of the aperture member 203.

Specifically, the control computer 110 reads writing data from the storage device 140, and calculates the area density of a pattern arranged in each mesh region of a plurality of mesh regions obtained by virtually dividing the writing region of the target object 101 or a chip region to be written into meshes. For example, the writing region of the target object 101 or a chip region to be written is divided into strip-shaped stripe regions each having a predetermined width. Then, each stripe region is virtually divided into a plurality of mesh regions described above. Preferably, the size of a mesh region is, for example, a beam size, or smaller than a beam size. For example, the size of a mesh region is preferably about 10 nm. The data processing unit 56 reads corresponding writing data from the storage device 140 for each stripe region, and assigns a plurality of figure patterns defined in the writing data to a mesh region, for example. Then, the area density of a figure pattern arranged in each mesh region is calculated.

The control calculator 110 calculates an irradiation time T (which hereinafter will also be called a shot time or an exposure time) of the electron beam per shot, for each predetermined sized mesh region. When performing multi-pass writing, an irradiation time T of the electron beam per shot in each hierarchy (or "each writing process") of multi-pass writing is calculated. It is preferable to obtain the irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations (not shown), such as a proximity effect, a fogging effect, or a loading effect. The size of a plurality of mesh regions for defining the irradiation time T and the size of a plurality of mesh regions where a pattern area density has been defined may be the same size or different sizes. When they are different sizes, each irradiation time T should be calculated after interpolating the area density by linear interpolation, etc. The irradiation time T for each mesh region is defined in an irradiation time map, and the irradiation time map is stored in the storage device 142, for example.

Moreover, the control calculator 110 converts the data of the irradiation time of a corresponding beam into ten-bit digital data, for example, and generates irradiation time arrangement data. The generated irradiation time arrangement data is output to the deflection control circuit 130.

For each shot, the deflection control circuit 130 outputs irradiation time arrangement data to each control circuit 41.

In the writing step, under the control of the writing control unit 58, the writing unit 150 performs writing corresponding to the irradiation time concerned, for each shot of each beam. Specifically, it operates as described below.

The electron beam 200 emitted from the electron gun assembly 201 (emission unit) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated by the electron beam 200. For example, a plurality of quadrangular electron beams (multi-beams) 20a to 20e are formed by letting portions of the electron beam 200, which is irradiating the positions of a plurality of holes, respectively pass through a corresponding hole of the plurality of holes of the aperture member 203. The multi-beams 20a to 20e respectively pass through corresponding blankers (first deflectors: separate blanking systems) of the blanking plate 204. Each blanker deflects (performs blanking deflection) a separately passing electron beam 20.

The multi-beams 20a, 20b, . . . , 20e having passed through the blanking plate 204 are reduced by the reducing lens 205, and travel toward the hole in the center of the limiting aperture member 206. At this time, the electron beam 20 deflected by the blanker of the blanking plate 204 deviates from the hole in the center of the limiting aperture member 206 (blanking aperture member) and is blocked by the limiting aperture member 206. On the other hand, the electron beam 20 which was not deflected by the blanker of the blanking plate 204 passes through the hole in the center of the limiting aperture member 206 as shown in FIG. 1. Blanking control is performed by ON/OFF of the separate blanking system in order to control ON/OFF of the beam. Thus, the limiting aperture member 206 blocks each beam which was deflected to be beam OFF by the separate blanking system. One beam shot is formed by a beam which has been formed during from a beam ON state to a beam OFF state and has passed through the limiting aperture member 206. The multi beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective writing positions (irradiation positions) on the target object 101. Moreover, for example, while the XY stage 105 is continuously moving, the deflector 208 controls such that irradiation positions of beams follow the movement of the XY stage 105. The position of the XY stage 105 is measured by using a reflected light which is obtained by irradiating a laser onto the mirror 210 on the XY stage 105 from the stage position detector 139. Ideally, multi-beams 20 to irradiate at a time are aligned at pitches obtained by multiplying the arrangement pitch of a plurality of holes of the aperture member 203 by the desired reduction ratio described above. The writing apparatus 100 executes a writing operation by the raster scan method that sequentially performs irradiation of a shot beam in order, and when writing a desired pattern, a beam needed according to a pattern is controlled to be beam ON by blanking control.

At this point, with respect to the separate blanking system 47 which was found to have a disconnection between the control circuit 41 and the control electrode 24 by the inspection performed before the mounting in the writing apparatus 100, the input of the CMOS inverter circuit 68 is made to be an H electric potential. Thereby, a positive potential Vdd is applied, through the pull-up resistor 66, to the control electrode 24 of the separate blanking system 47 in which a disconnection has occurred between the control circuit 41 and the control electrode 24, and, on the other hand, a ground potential is applied to the counter electrode 26 from the control circuit 43. Therefore, since the passing beams are deflected by the potential difference between the electrodes and blocked by the limiting aperture 206, the beams can be made to be off.

On the other hand, with respect to a group including the separate blanking system 47 in which a short circuit has occurred between the control electrode 24 and the counter electrode 26, for example, it is acceptable, before the target object is irradiated by beams having passed through the separate blanking systems 47 in the group concerned, to transfer a movable blocking member to be directly underneath the beams in order to compulsorily block them, similarly to the method of Japanese Patent Application Laid-open (JP-A) No. 2013-128031 described above.

Moreover, in the blanking plate 204 according to the first embodiment, using the control circuit 43 (cancellation circuit), it is possible to control the beam fixed ON state due to that the electric potential of the control electrode 24 is always fixed to the ground potential to be a beam OFF state. Specifically, when the electric potential of the control electrode 24 is always fixed to the ground potential, an L electric potential (active electric potential) is applied to the input (IN) of the CMOS inverter circuit 68. Thereby, since the electric potential of the counter electrode 26 substantially becomes a positive potential (Vdd), a beam OFF state can be obtained by deflecting a corresponding beam toward the counter electrode 26, which is opposite to the direction of the usual blanking deflection, to irradiate the limiting aperture member 206 by the beam. In other words, when the electric potential of the control electrode 24 (first electrode) is fixed to a ground potential, the control circuit 43 (electric potential change unit) changes the potential of the counter electrode 26 (second electrode), which is grounded, to a positive potential from the ground potential. Thus, the CMOS inverter circuit 68 (second potential applying unit) in the control circuit 43 (electric potential change unit) alternatively selectively applies two different electric potentials (Vdd, and ground potential) including a positive potential to the counter electrode 26 (second electrode). Moreover, with respect to a group including the separate blanking system 47 being fixed to a beam ON state, the input of each CMOS inverter circuit 70 should be an H electric potential and the input of the CMOS inverter circuit 68 should be an L electric potential. Thereby, from the beginning, a ground potential is applied to the control electrode 24 of the separate blanking system 47 being fixed to a beam ON state, and ground potentials are applied from the control circuit 41 to the control electrodes 24 of the normal separate blanking systems 47 in the group concerned. On the other hand, a positive potential Vdd is applied to the counter electrode 26 from the control circuit 43. Therefore, since passing beams are deflected by the potential difference between the electrodes, and blocked by the limiting aperture 206, they become in an OFF state.

According to the first embodiment, since the group including a defective separate blanking system is removed from the writing processing, the irradiation positions which should have been written by beams passing through the separate blanking systems 47 in the group concerned have not been written. Then, according to the first embodiment, an additional exposure is performed so that a group composed of normal separate blanking systems 47 may write such irradiation positions. Thereby, even if groups are partly unusable, highly accurate writing processing can be executed.

As described above, according to the first embodiment, it is possible, at the stage before mounting a blanking device in the writing apparatus, to inspect whether a separate blanking system in which at least a short circuit (Short) between electrodes or an electrode line open (Open) has occurred exists in the blanking device.

Second Embodiment

In the first embodiment, there has been described an example of a structure in which beams can be controlled to be off even when a disconnection occurs between the control circuit 41 and the control electrode 24, or the control electrode 24 is fixed to a ground potential, but it is not limited thereto. According to the second embodiment, another example will be described. The structure of the writing apparatus 100 is the same as that of FIG. 1. The contents of the present embodiment are the same as those of the first embodiment except what is described below.

Figure 12:
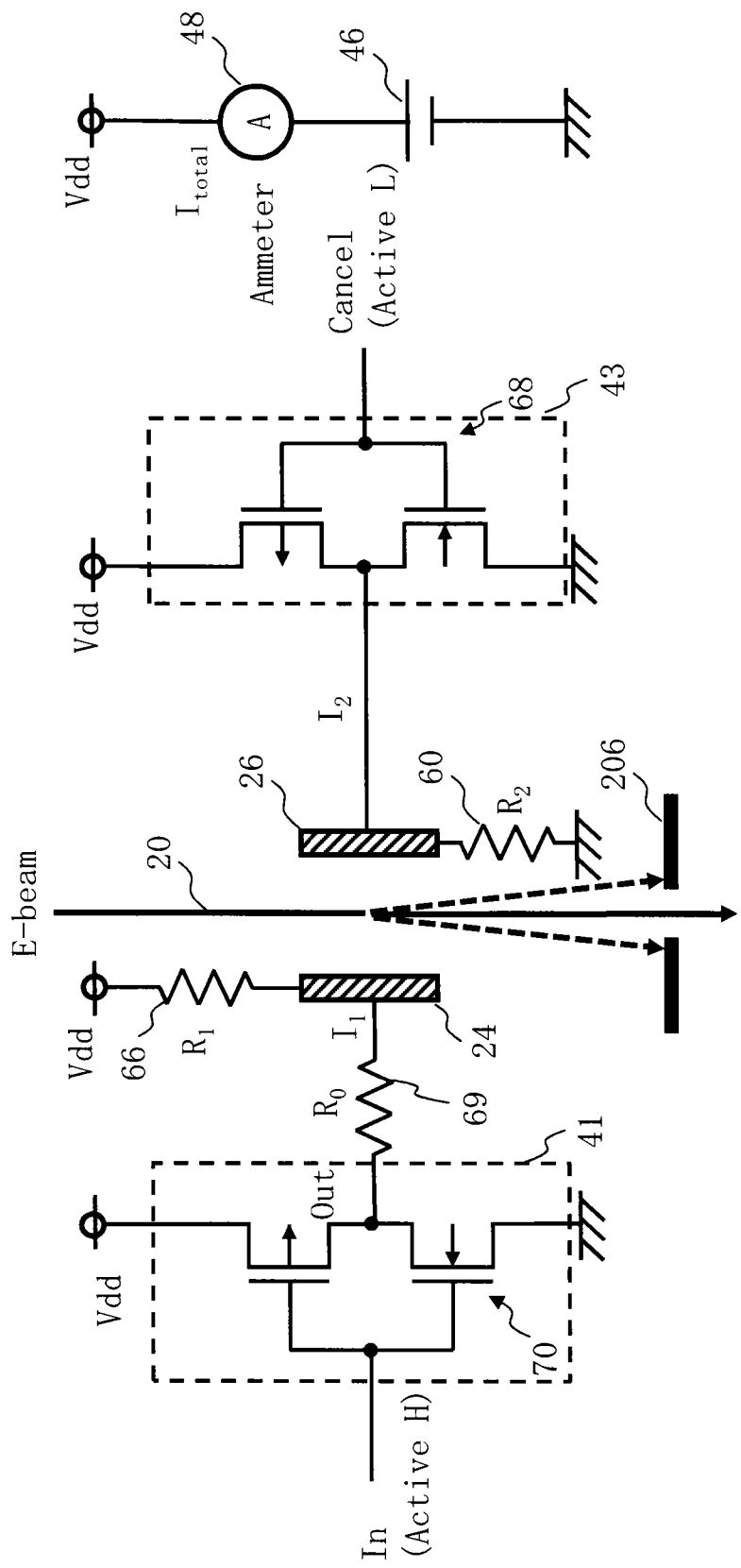
FIG. 12 shows an example of a separate blanking system according to a second embodiment.

FIG. 12 shows an example of a separate blanking system according to the second embodiment. FIG. 12 is the same as FIG. 4 except that the arrangement position of the protective resistor 69 has been changed to the control electrode 24 side from the counter electrode 26 side. That is, in FIG. 12, one of both the terminals of the pull-up resistor 66 and that of the protective resistor 69 are connected to the control electrode 24, and the output terminal of the control circuit 41 is connected to the other of the terminals of the protective resistor 69. The resistance value of the protective resistor 69 is set to a sufficiently low value. When a short circuit occurs between the control electrode 24 and the counter electrode 26, the inverter circuit 70 of the control circuit 41 and the inverter circuit 68 of the control circuit 43 can be protected by the protective resistor 69. In addition, the protective register 69 prevents an electron, scattered by the aperture member 203 on the blanking plate 204 and intruded through the control electrode 24, from damaging the inverter circuit 70 of the control circuit 41. With respect to the arrangement position of the protective resistor, in aiming to protect the inverter circuit 70 which is more important, the present embodiment is more preferable than the first embodiment.

Since the protective resistor 69 is usually inserted in the circuit which has no resistance (in order to reduce a time constant τ=CR due to a stray capacitance C of the circuit), it is desirable to make the resistance value of the protective resistor 69 as low as possible. Considering a voltage division ratio between the protective resistor 69 and the pull-up resistor 66, the resistance value of the protective resistor 69 is preferably lower than or equal to several hundreds of Ω, and more preferably lower than or equal to several tens of Ω, for example. On the other hand, the pull-down resistor 60 and the output terminal of the control circuit 43 are connected to the counter electrode 26. The theoretical value of a flowing current in this structure differs from that of the separate blanking system shown in FIG. 4.

FIG. 13 shows a relation of currents flowing through the separate blanking system according to the second embodiment. As shown in FIG. 13, the relation of currents flowing through the separate blanking system 47 is shown using a resistance value $R_1$ of the pull-up resistor 66, a resistance value $R_2$ of the pull-down resistor 60, a resistance value $R_0$ of the protective resistor 69, and a positive potential Vdd. FIG. 13 shows an absolute value $|I_1|$ of a current $I_1$ flowing between the CMOS inverter circuit 70 and the control electrode 24, an absolute value $|I_2|$ of a current $I_2$ flowing between the CMOS inverter circuit 68 and the counter electrodes 26, and a current value Itotal of all the currents flowing through the ammeter 48. FIG. 13 shows the states, namely: a normal state in which a normal blanking operation can be performed without any malfunction in the separate blanking system 47, a short-circuit state (short between electrodes) in which a short circuit (short) has occurred between the control electrode 24 and the counter electrodes 26, and a floating state (electrode line open) between the CMOS inverter circuit 70 and the control electrode 24 due to a disconnection, etc. between the CMOS inverter circuit 70 and the control electrode 24. In the state of electrode line open, even if a disconnection, etc. occur between the CMOS inverter circuit 70 and the control electrode 24, since the pull-up resistor 66 is connected to the control electrode 24, a positive potential Vdd is applied to the control electrode 24. Therefore, it goes without saying that the control electrode 24 does not actually become a floating state.

(1) "Normal" case will be described below.

(1-1) When the input of the CMOS inverter circuit 70 is an H electric potential and the input of the CMOS inverter circuit 68 is an H electric potential, the absolute value $|I_1|$ of a current $I_1$ is $Vdd/(R_0+R_1)$, the absolute value $|I_2|$ of a current $I_2$ is zero, and the current value Itotal of all the currents is $Vdd/(R_0+R_1)$.

(1-2) When the input of the CMOS inverter circuit 70 is an H electric potential and the input of the CMOS inverter circuit 68 is an L electric potential, the absolute value $|I_1|$ of the current $I_1$ is $Vdd/(R_0+R_1)$, the absolute value $|I_2|$ of the current $I_2$ is $Vdd/R_2$, and the current value Itotal of all the currents is $Vdd/(R_0+R_1)+Vdd/R_2$.

(1-3) When the input of the CMOS inverter circuit 70 is an L electric potential and the input of the CMOS inverter circuit 68 is an H electric potential, the absolute value $|I_1|$ of the current $I_1$ is zero, the absolute value $|I_2|$ of the current $I_2$ is zero, and the current value Itotal of all the currents is zero.

(1-4) When the input of the CMOS inverter circuit 70 is an L electric potential and the input of the CMOS inverter circuit 68 is an L electric potential, the absolute value $|I_1|$ of the current is zero, the absolute value $|I_2|$ of the current $I_2$ is $Vdd/R_2$, and the current value Itotal of all the currents is $Vdd/R_2$.

(2) "Short between electrodes" case will be described below.

(2-1) When the input of the CMOS inverter circuit 70 is an H electric potential and the input of the CMOS inverter circuit 68 is an H electric potential, the absolute value $|I_1|$ of the current $I_1$ is zero, the absolute value $|I_2|$ of the current $I_2$ is $Vdd/R_1$, and the current value Itotal of all the currents is $Vdd/R_1$.

(2-2) When the input of the CMOS inverter circuit 70 is an H electric potential and the input of the CMOS inverter circuit 68 is an L electric potential, the absolute value $|I_1|$ of the current $I_1$ is $Vdd/R_1$, and the absolute value $|I_2|$ of the current $I_2$ is $Vdd/R_2$. The current value Itotal of all the currents is $Vdd(R_0+R_2)/R_0R_2$.

(2-3) When the input of the CMOS inverter circuit 70 is an L electric potential and the input of the CMOS inverter circuit 68 is an H electric potential, the absolute value $|I_1|$ of the current $I_1$ is $Vdd/R_0$, and the absolute value $|I_2|$ of the current $I_2$ is $Vdd(R_0+R_1)/R_0R_1$. The current value Itotal of all the currents is $Vdd(R_0+R_2)/R_0R_2$.

(2-4) When the input of the CMOS inverter circuit 70 is an L electric potential and the input of the CMOS inverter circuit 68 is an L electric potential, the absolute value $|I_1|$ of the current $I_1$ is zero, the absolute value $|I_2|$ of the current $I_2$ is $Vdd/R_2$, and the current value Itotal of all the currents is $Vdd/R_2$.

(3) "Electrode line open" case will be described below.

(3-1) When the input of the CMOS inverter circuit 70 is an H electric potential and the input of the CMOS inverter circuit 68 is an H electric potential, the absolute value $|I_1|$ of the current $I_1$ is zero, the absolute value $|I_2|$ of the current $I_2$ is zero, and the current value Itotal of all the currents is zero.

(3-2) When the input of the CMOS inverter circuit 70 is an H electric potential and the input of the CMOS inverter circuit 68 is an L electric potential, the absolute value $|I_1|$ of the current $I_1$ is zero, the absolute value $|I_2|$ of the current $I_2$ is $Vdd/R_2$, and the current value Itotal of all the currents is $Vdd/R_2$.

(3-3) When the input of the CMOS inverter circuit 70 is an L electric potential and the input of the CMOS inverter circuit 68 is an H electric potential, the absolute value $|I_1|$ of the current $I_1$ is zero, the absolute value $|I_2|$ of the current $I_2$ is zero, and the current value Itotal of all the currents is zero.

(3-4) When the input of the CMOS inverter circuit 70 is an L electric potential and the input of the CMOS inverter circuit 68 is an L electric potential, the absolute value $|I_1|$ of the current $I_1$ is zero, the absolute value $|I_2|$ of the current $I_2$ is $Vdd/R_2$, and the current value Itotal of all the currents is $Vdd/R_2$.

Therefore, it turns out that when the input of the CMOS inverter circuit 70 is an L electric potential and the input of the CMOS inverter circuit 68 is an H electric potential, if the current value Itotal of all the currents is zero, the separate blanking system 47 to be measured is in the normal state in which a normal blanking operation can be performed without any malfunction, or in the floating state (electrode line Open) between the CMOS inverter circuit 70 and the control electrode 24 due to disconnection, etc. between the CMOS inverter circuit 70 and the control electrode 24. On the other hand, it turns out that if the current value Itotal of all the currents is not zero but a finite value ($Vdd(R_0+R_1)/R_0R_1$+ measurement error), the separate blanking system 47 to be measured is in the short-circuit state (Short between electrodes) where a short circuit (short) has occurred between the control electrode 24 and the counter electrodes 26.

If, when the input of the CMOS inverter circuit 70 is an L electric potential and the input of the CMOS inverter circuit 68 is an H electric potential, the current value Itotal of all the currents is zero, and when the input of the CMOS inverter circuit 70 is an H electric potential and the input of the CMOS inverter circuit 68 is an H electric potential, the current value Itotal of all the currents is not zero but a finite value ($Vdd/(R_0+R_1)$+ measurement error), it turns out that the separate blanking system 47 to be measured is in the normal state (Normal) where a normal blanking operation can be performed without any malfunction. On the other hand, if, when the input of the CMOS inverter circuit 70 is an L electric potential and the input of the CMOS inverter circuit 68 is an H electric potential, the current value Itotal of all the currents is zero, and when the input of the CMOS inverter circuit 70 is an H electric potential and the input of the CMOS inverter circuit 68 is an H electric potential, the current value Itotal of all the currents is zero, it turns out that the separate blanking system 47 to be measured is in a state (electrode line open) where the control electrode 24 is in a floating state.

Moreover, when the operation described above is performed simultaneously for a plurality of separate blanking systems 47, it will be described below. In such a case, the current value Itotal of all the currents is a resultant value of a plurality of separate blanking systems 47 to be measured.

It turns out that when the input of each CMOS inverter circuit 70 is an L electric potential and the input of each CMOS inverter circuit 68 is an H electric potential, if the current value Itotal of all the currents is zero, a plurality of separate blanking systems 47 to be measured are in the normal state where a normal blanking operation can be performed without any malfunction, or in a floating state (electrode line open) between the CMOS inverter circuit 70 and the control electrode 24 due to disconnection, etc. between the CMOS inverter circuit 70 and the control electrode 24. On the other hand, it turns out that if the current value Itotal of all the currents is not zero but a finite value ($n \cdot Vdd(R_0+R_1)/R_0R_1$+ measurement error), n separate blanking systems 47 of a plurality of separate blanking systems 47 to be measured are in a short-circuit state (Short between electrodes) where a short circuit (short) has occurred between the control electrode 24 and the counter electrodes 26.

If, when the input of the CMOS inverter circuit 70 is an L electric potential and the input of the CMOS inverter circuit 68 is an H electric potential, the current value Itotal of all the currents is zero, and when the input of the CMOS inverter circuit 70 is an H electric potential and the input of the CMOS inverter circuit 68 is an H electric potential, the current value Itotal of all the currents is not zero but a finite value (m·Vdd/($R_0+R_1$)+ measurement error), it turns out that m separate blanking systems 47 of a plurality of separate blanking systems 47 (S separate blanking systems 47) to be measured are in the normal state where a normal blanking operation can be performed without any malfunction. Then, it turns out that the remaining (S−m) separate blanking systems 47 are in a floating state (electrode line open) between the CMOS inverter circuit 70 and the control electrode 24 due to disconnection, etc. between the CMOS inverter circuit 70 and the control electrode 24.

Then, according to the second embodiment, similarly to the first embodiment, the blanking plate 204 is inspected by measuring the current value Itotal of all the currents and determining the measurement result. Similarly to the first embodiment, each determination result is output. By employing the inspection method of the second embodiment, it becomes possible to inspect the blanking plate 204 (blanking device) at the stage before placing it in the writing apparatus 100.

The inspection method for a blanking device for the multi-beams according to the second embodiment is the same as that shown in FIG. 6.

In the determination (1) step (S104), for example, when the number of the separate blanking systems 47 placed on the blanking plate 204 (blanking device) is S, if a short circuit has occurred in each of the S separate blanking systems 47, the current value Itotal of all the currents is theoretically a finite value of S·Vdd($R_0+R_1$)/$R_0R_1$. Moreover, if a short circuit has occurred in each of n separate blanking systems 47 in the S separate blanking systems 47, the current value Itotal of all the currents is theoretically a finite value of n·Vdd($R_0+R_1$)/$R_0R_1$. However, actually, since a measurement error is included, it is difficult to perform measurement using a theoretical value. Then, according to the second embodiment, a permissible value "a" for the number of short circuits (shorts) to occur on the blanking plate 204 is set in advance. Then, a threshold value is preset using the permissible value "a". For example, the threshold value is set to a finite value of a·Vdd($R_0+R_1$)/$R_0R_1$. If a measured current value Itotal is not zero but a finite value less than or equal to the threshold value, it is determined that there are separate blanking systems 47 in each of which a short circuit (short) has occurred and whose number is within the permissible value. When a measured current value Itotal exceeds the threshold value, it is determined that the blanking plate 204 concerned is unusable.

On the other hand, when the current value Itotal of all the currents is zero, it is determined that all the separate blanking systems 47 (a plurality of separate blanking systems 47) placed on the blanking plate 204 (blanking device) are respectively in the normal state (Normal) where a normal blanking operation can be performed without any malfunction, or in an open state (electrode line open) between the CMOS inverter circuit 70 and the control electrode 24 due to disconnection, etc. between the CMOS inverter circuit 70 and the control electrode 24, which is the same as the first embodiment. The determination result is output.

In the determination (2) step (S108), for example, when the number of the separate blanking systems 47 placed on the blanking plate 204 (blanking device) is S, if the S separate blanking systems 47 are in the normal state (Normal) in which a normal blanking operation can be performed without any malfunction, the current value Itotal of all the currents is theoretically a finite value of S·Vdd/($R_0+R_1$). If m separate blanking systems 47 in the S separate blanking systems 47 are in the normal state (Normal) where a normal blanking operation can be performed without any malfunction, the current value Itotal of all the currents is theoretically a finite value of m·Vdd/($R_0+R_1$). However, actually, since a measurement error is included, it is difficult to perform measurement using a theoretical value. Then, according to the second embodiment, an allowable number "b" of the number of separate blanking systems 47 in each of which a disconnection is to occur on the blanking plate 204 is set in advance. Then, a threshold value is preset using the allowable number "b". For example, the threshold value is set to a finite value of (S−b)·Vdd/($R_0+R_1$). If a measured current value Itotal is lower than the threshold value, it is determined that the number of the separate blanking systems 47 in the normal state (Normal) where a normal blanking operation can be performed without any malfunction is insufficient, in other words, the separate blanking systems 47 in each of which a disconnection has occurred and whose number exceeds the preset allowable number "b" (first allowable number) exist in all the separate blanking systems 47 (a plurality of separate blanking systems 47) placed on the blanking plate 204 (blanking device). The determination result is output.

In the determination (3) step (S124), for example, when the number of the separate blanking systems 47 in a group to be measured is S', if a short circuit has occurred in each of the S' separate blanking systems 47, the current value Itotal of all the currents is theoretically a finite value of S'·Vdd($R_0+R_1$)/$R_0R_1$. If a short circuit has occurred in each of n' separate blanking systems 47 in the S' separate blanking systems 47, the current value Itotal of all the currents is theoretically a finite value of n'·Vdd($R_0+R_1$)/$R_0R_1$. Therefore, when the current value Itotal of all the currents is a finite value, it turns out that there is, in the group concerned, the separate blanking system 47 in which a short circuit (short) has occurred. Then, with respect to the group including the separate blanking system 47 in which a short circuit (short) has occurred, measures will be taken so that beams may not reach the target object 101 when mounted in the writing apparatus 100. The determination result is output.

In the determination (4) step (S128), for example, when the number of the separate blanking systems 47 in a group to be measured is S', if the S' separate blanking systems 47 are respectively in the normal state (Normal) in which a normal blanking operation can be performed without any malfunction, the current value Itotal of all the currents is theoretically a finite value of S'·Vdd/($R_0+R_1$). Therefore, the threshold value is set in advance. For example, the threshold value is set to a finite value of S'·Vdd/($R_0+R_1$). Then, if a measured current value Itotal is lower than the threshold value, it turns out that the separate blanking system 47 in which disconnection has occurred exists in the group concerned. The determination result is output.

As described above, according to the second embodiment, similarly to the first embodiment, it is possible, at the stage before mounting the blanking plate 204 (blanking device) in the writing apparatus 100, to inspect whether a separate blanking system in which a short circuit (Short) has occurred exists in the blanking plate 204. Moreover, it is possible, at the stage before mounting the blanking plate 204 (blanking device) in the writing apparatus 100, to inspect whether a separate blanking system in which disconnection has occurred between the control circuit 41 and the control electrode 24 exists in the blanking plate 204. Furthermore, it is possible, in each group as a unit, to specify a separate blanking system in which a short circuit (short) has occurred or disconnection has occurred between the control circuit 41 and the control electrode 24.

Embodiments have been explained referring to concrete examples described above. However, the present invention is not limited to these specific examples. While the case of inputting a ten-bit control signal for controlling each control circuit 41 has been described above, the number of bits may be suitably set. For example, a two-bit (or three to nine bit) control signal may be used. Further, an eleven or more bit control signal may also be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other blanking device for multi charged particle beams, multi charged particle beam writing apparatus, and inspection method for a blanking device for multi charged particle beams that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inspection method for a blanking device for multi charged particle beams, for inspecting whether a separate blanking system of the blanking device is defective, comprising:
    measuring a first current value of a current flowing from a power source that supplies a voltage based on a potential difference between a first potential and a second potential to each of a plurality of separate blanking systems, using the blanking device having the plurality of separate blanking systems,
    wherein the each of the plurality of separate blanking systems arranged in an array for performing blanking control of a corresponding beam in the multi charged particle beams, the each of the plurality of separate blanking systems includes
        a first potential applying unit configured to be able to alternatively selectively apply the first potential and the second potential,
        a first resistor configured to be applied with the first potential,
        a first electrode configured to be alternatively selectively applied with the first potential and the second potential from the first potential applying unit, and connected to the first resistor,
        a second resistor configured to be applied with the second potential,
        a second electrode configured to be connected to the second resistor, and alternatively selectively applied with the first potential and the second potential through a line, and
        a third resistor configured to be connected between the first potential applying unit and the first electrode or connected in series in the line, and
    the blanking device further includes at least one second potential applying unit configured to be able to alternatively selectively apply the first potential and the second potential to the second electrode of the each of the plurality of separate blanking systems, and
    the measuring is performed in a state where, in the each of the plurality of separate blanking systems, the first potential is applied to the first electrode from the first potential applying unit, and the second potential is applied to the second electrode from a corresponding second potential applying unit in the at least one second potential applying unit; and
    determining that a separate blanking system in which a short circuit has occurred exists in the plurality of separate blanking systems when the first current value measured is a finite value and lower than or equal to a first threshold having been set in advance, and outputting a result of the determining.

2. The method according to claim 1, wherein the first potential is a positive potential, and the second potential is a ground potential.

3. The method according to claim 2, further comprising:
    determining, when the first current value measured exceeds the first threshold value, that the blanking device is unusable, and outputting a result of the determining.

4. The method according to claim 3, wherein the first threshold value is set by using a permissible value for a number of separate blanking systems in each of which a short circuit occurs in the plurality of separate blanking systems.

5. The method according to claim 1 further comprising:
    measuring a second current value flowing from the power source, in a state where the second potential is applied to the first electrode from the first potential applying unit and the second potential is applied to the second electrode from a corresponding one of the at least one second potential applying unit for the each of the plurality of separate blanking systems; and
    determining that separate blanking systems in each of which a disconnection has occurred and whose number exceeds a first allowable number having been set in advance exist in the plurality of separate blanking systems, when the second current value measured is a finite value and lower than a second threshold value having been set in advance, and outputting a result of the determining.

6. The method according to claim 5, wherein the second potential is a ground potential.

7. The method according to claim 5 further comprising:
    determining that the blanking device is usable, when the second current value measured is greater than or equal to the second threshold value, and outputting a result of the determining.

8. The method according to claim 1 further comprising:
    grouping the plurality of separate blanking systems into a plurality of groups each composed of some separate blanking systems in the plurality of separate blanking systems;
    measuring a third current value flowing from the power source that supplies a voltage
    based on a potential difference between the first potential and the second potential to the each of the plurality of separate blanking systems, for each of the plurality of groups, in a state where the first potential is applied to the first electrode from the first potential applying unit in each of the some separate blanking systems in a group concerned, the second potential is applied to the second electrode from a corresponding second potential applying unit in the at least one second potential applying unit in each of the some separate blanking systems in a group concerned, and a current is controlled not to flow in each of the some separate blanking systems in other groups of the plurality of groups; and determining that a separate blanking system in which a short circuit has occurred exists in the some separate blanking systems in the group concerned, for the each of the plurality of groups, when the third current value measured is a finite value, and outputting a result of the determining.

9. The method according to claim 1, wherein the first potential is a positive potential, and the second potential is a ground potential.

10. The method according to claim 8 further comprising:
measuring a fourth current value flowing from the power source, in a state where the second potential is applied to the first electrode from the first potential applying unit, the second potential is applied to the second electrode from a corresponding second potential applying unit in the at least one second potential applying unit, and a current is controlled not to flow in each of the some separate blanking systems in other groups of the plurality of groups, for the each of the plurality of groups, in the each of the some separate blanking systems in a group concerned; and determining that a separate blanking system in which a disconnection has occurred exists in the some separate blanking systems in the group concerned, for the each of the plurality of groups, when the fourth current value measured is a finite value and lower than a third threshold value having been set in advance.

* * * * *